(12) United States Patent
Marvin et al.

(10) Patent No.: US 10,361,650 B2
(45) Date of Patent: Jul. 23, 2019

(54) HALF-BRIDGE SWITCHING CIRCUIT SYSTEM

(71) Applicant: LCDRIVES CORP., Potsdam, NY (US)

(72) Inventors: Russel Hugh Marvin, Potsdam, NY (US); David H. Leach, West Hartford, CT (US)

(73) Assignee: LCDRIVES CORP., Goshen, CT (US)

( * ) Notice: Subject to any disclaimer, the term of this patent is extended or adjusted under 35 U.S.C. 154(b) by 0 days.

(21) Appl. No.: 15/790,561

(22) Filed: Oct. 23, 2017

(65) Prior Publication Data

US 2018/0048255 A1 Feb. 15, 2018

Related U.S. Application Data

(63) Continuation-in-part of application No. 15/092,064, filed on Apr. 6, 2016, now Pat. No. 9,813,008.

(51) Int. Cl.
| | |
|---|---|
| *H02M 7/00* | (2006.01) |
| *H05K 1/02* | (2006.01) |
| *H05K 1/18* | (2006.01) |
| *H02M 7/483* | (2007.01) |
| *H02P 27/06* | (2006.01) |
| *H02P 27/14* | (2006.01) |
| *H02P 29/02* | (2016.01) |
| *H03K 17/16* | (2006.01) |

(52) U.S. Cl.
CPC ............ *H02P 27/06* (2013.01); *H02M 7/003* (2013.01); *H02P 27/14* (2013.01); *H02P 29/02* (2013.01); *H03K 17/161* (2013.01); *H05K 1/0204* (2013.01); *H05K 1/181* (2013.01); *H02M 2007/4835* (2013.01); *H05K 2201/10015* (2013.01); *H05K 2201/10166* (2013.01); *H05K 2201/10522* (2013.01); *H05K 2201/10545* (2013.01)

(58) Field of Classification Search
CPC ....................................................... H02P 27/06
USPC .................................................. 318/504, 34
See application file for complete search history.

(56) References Cited

U.S. PATENT DOCUMENTS

| | | | | |
|---|---|---|---|---|
| 5,038,088 | A | 8/1991 | Arends et al. | |
| 5,532,512 | A * | 7/1996 | Fillion | H01L 25/071 257/686 |
| 6,646,331 | B2 * | 11/2003 | Sakamoto | G11B 5/4853 257/675 |
| 8,502,484 | B2 * | 8/2013 | Hill | H01L 25/072 318/280 |

(Continued)

*Primary Examiner* — David Luo
(74) *Attorney, Agent, or Firm* — Tarolli, Sundheim, Covell & Tummino LLP

(57) ABSTRACT

One example includes a half-bridge switching circuit system. The system includes a first plurality of switches arranged between a first rail voltage and an output on which an output voltage is provided and a second plurality of switches arranged between a second rail voltage and the output, the first and second pluralities of switches being controlled via a plurality of switching signals. The system also includes a plurality of flying capacitors arranged to interconnect the first and second pluralities of switches, and further includes a plurality of snubber circuits that are each arranged in parallel with a respective one of the plurality of flying capacitors, the first plurality of switches, and the second plurality of switches.

51 Claims, 11 Drawing Sheets

(56) References Cited

U.S. PATENT DOCUMENTS 8,503,195 B1 8/2013 Mogilevski
8,866,169 B2 10/2014 Emerson et al.
9,246,389 B2 * 1/2016 Ryoo .................... H02M 3/285

* cited by examiner

HALF-BRIDGE SWITCHING CIRCUIT SYSTEM

RELATED APPLICATIONS

This application claims priority from U.S. patent application Ser. No. 15/092,064, filed 6 Apr. 2016, which is incorporated herein in its entirety.

TECHNICAL FIELD

The present description relates generally to electronic circuits, and specifically to a half-bridge switching circuit system.

BACKGROUND

Half-bridge switching circuits can be implemented for a variety of applications to provide an output current/output voltage. As an example, motor drives can be implemented with half-bridge switching circuits. Many of the applications of motors in modern society implement variable speed drives to save energy, and all variable speed applications require an electronic drive to control the speed of the respective motor(s). Most variable-speed motor drives today use two-level converter architectures where each leg of the drive is a half-bridge switching circuit comprised of two switches. This configuration requires that each switch be rated for the full voltage of the application but minimizes the number of required parts and simplifies the design and control of the motor drive. Multi-level converters with three or more hard-switched voltage levels have also been developed for medium and high-power applications because they can generate higher quality output waveforms and achieve higher output voltages than the ratings of individual solid-state switching devices.

SUMMARY

One example includes a half-bridge switching circuit system. The system includes a first plurality of switches arranged between a first rail voltage and an output on which an output voltage is provided and a second plurality of switches arranged between a second rail voltage and the output, the first and second pluralities of switches being controlled via a plurality of switching signals. The system also includes a plurality of flying capacitors arranged to interconnect the first and second pluralities of switches, and further includes a plurality of snubber circuits that are each arranged in parallel with a respective one of the plurality of flying capacitors, the first plurality of switches, and the second plurality of switches.

Another embodiment includes a circuit system. The system includes a printed-circuit board (PCB) comprising a surface on which a plurality of circuit components are arranged. The system also includes at least one thermally-conductive component that is coupled to the PCB, the at least one thermally-conductive component being configured to conduct heat that is generated on the PCB via the plurality of circuit components. The system further includes a T-clad material arrangement that is coupled to the at least one thermally-conductive component via a first material layer and is configured to conduct the heat from the at least one thermally-conductive component to the first material layer.

Another embodiment includes a motor driver system. The system includes a motor controller configured to generate a plurality of switching signals. The system also includes a half-bridge switching circuit configured to provide an output voltage via an output. The half-bridge switching circuit includes a first plurality of switches arranged between a first rail voltage and the output and a second plurality of switches arranged between a second rail voltage and the output. The first and second pluralities of switches can be controlled via the plurality of switching signals. The half-bridge switching circuit further includes a plurality of flying capacitors arranged to interconnect the first and second pluralities of switches, and further includes a plurality of snubber circuits such that each of the plurality of flying capacitors, each of the first plurality of switches, and each of the second plurality of switches is arranged in parallel with a respective one of the plurality of snubber circuits. The system further includes a double-sided printed-circuit board (PCB) comprising a first surface on which the first plurality of switches are arranged and a second surface on which the second plurality of switches are arranged. The second surface is opposite the first surface on the double-sided PCB.

DETAILED DESCRIPTION

Figure 1:
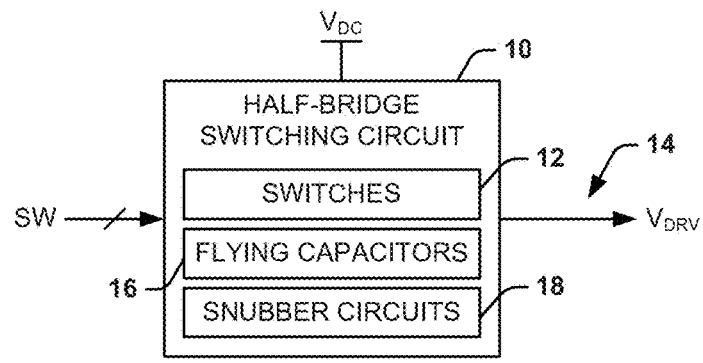
FIG. 1 illustrates an example of a half-bridge switching system.

The present description relates generally to electronic circuits, and specifically to a half-bridge switching circuit system. As an example, the half-bridge switching circuit system can be implemented in a motor driver system to control a motor. For example, the motor driver system can be implemented to provide variable speed control of a motor, such as a three-phase motor. The motor driver system includes a motor controller that is configured to generate a plurality of switching signals, such as based on a desired speed of the associated motor. The half-bridge switching circuit can thus be configured to provide an output voltage to the motor to set the speed of the motor. The half-bridge switching circuit includes a plurality of switches, such as a first set of switches interconnecting a first voltage rail (e.g., a positive voltage rail) and the output and a second set of switches interconnecting a second voltage rail (e.g., a negative voltage rail) and the output. For example, the switches can be arranged as gallium nitride (GaN) switches that can be implemented for very high speed switching. The half-bridge switching circuit also includes a plurality of flying capacitors that interconnect the first and second sets of switches in a cascaded arrangement, such as to provide the output voltage as having a variable amplitude based on the complementary activation of the sets of switches.

The half-bridge switching circuit also includes a plurality of snubber circuits that can each be arranged in parallel with the switches of each of the first and second sets of switches and with the flying capacitors. The snubber circuits can each include a series arrangement of a capacitor and a resistor, and can thus be configured to substantially mitigate the effects of unavoidable stray circuit inductance in series with the respective switches and flying capacitors. A peak voltage across the switches during voltage overshoot on switching transitions can increase as switching time decreases (e.g., because of the momentary voltage generated across the stray inductances in the circuit when the current transitions rapidly), but decreases with the addition of the snubber circuits which can partially absorb the energy stored in the stray inductances. Therefore, the snubber circuits can be configured to substantially reduce voltage overshoot and thus facilitate high speed switching of the switches of the switching circuit.

In addition, the half-bridge switching circuit system can be arranged to dissipate heat in an efficient manner. As an example, the half-bridge switching circuit can be arranged on a double-sided printed circuit board (PCB), such that the first set of switches can be coupled to a first surface of the double-sided PCB and the second set of switches can be coupled to a second surface of the double-sided PCB that is opposite the first surface. As a result, the half-bridge switching circuit can be arranged in a more compact arrangement of the PCB, and can dissipate heat in opposite directions with respect to the PCB. Additionally, the PCB can be arranged between two T-clad material arrangements that can be coupled to the PCB via one or more conductive material components on each surface of the PCB. Thus, the conductive material components can provide heat transfer from each surface of the PCB to the T-clad material arrangements, such that the T-clad material arrangements can radiate the heat from the PCB. Accordingly, the motor driver system can also provide sufficient heat dissipation of the associated circuitry.

FIG. 1 illustrates an example of a half-bridge switching system 10. The half-bridge switching system 10 can be implemented in any of a variety of switching applications, such as motor control applications to control the speed and direction of a motor. In the example of FIG. 1, the half-bridge switching system 10 includes is configured to generate an output voltage $V_{DRV}$ at an output 14 based on a DC rail voltage $V_{DC}$. As an example, the rail voltage $V_{DC}$ can split with a center tap, and can thus include a positive portion and a negative portion relative to the center tap. As an example, the output voltage $V_{DRV}$ can be provided to a motor to control the speed and/or torque of the motor.

In the example of FIG. 1, the half-bridge switching system 10 includes a set of switches 12 that are selectively activated via a set of switching signals SW to generate the output voltage $V_{DRV}$ based on the rail voltage $V_{DC}$. As an example, the switching signals SW can be generated via a programmable controller (e.g., a motor controller). For example, the switches 12 can be configured as gallium nitride (GaN) MOSFET switches that can be implemented for very high speed switching (e.g., greater than 50 kHz). Alternatively, the switches 12 can be configured as other types of switches, such as silicon (Si), silicon carbide, or other material-type switches. As an example, the switches 12 can include a first set of switches interconnecting a positive portion of the rail voltage $V_{DC}$ and the output 14 and a second set of switches interconnecting a negative portion of the rail voltage $V_{DC}$ and the output 14. In addition, the half-bridge switching system 10 includes a plurality of flying capacitors 16 that interconnect the sets of the switches 12 in a cascaded arrangement to provide the output voltage $V_{DRV}$ as having a variable amplitude based on the complementary activation of the sets of the switches 12.

In addition, in the example of FIG. 1, the half-bridge switching system 10 also includes snubber circuits 18. As an example, the snubber circuits 18 can each be configured as a series arrangement of a capacitor and a resistor, such that the snubber circuits 18 are arranged in parallel with the switches 12 and the flying capacitors 16. The snubber circuits 18 can thus be configured to substantially reduce the voltage overshoot across the switches 12 on the switching transitions. As a result, the snubber circuits 18 can be implemented to substantially mitigate damage to the switches 12 during operation of the half-bridge switching system 10. Additionally, by reducing the voltage overshoot across the switches 12, the snubber circuits 18 can also facilitate more rapid switching speeds of the switches 12, such as to implement the very high switching speeds of switches 12 that are configured as GaN MOSFET switches. Furthermore, the snubber circuits 18 in parallel with each of the flying capacitors 16 are likewise configured to mitigate an inductance associated with the flying capacitors 16 between the respective sets of the switches 12.

Figure 2:
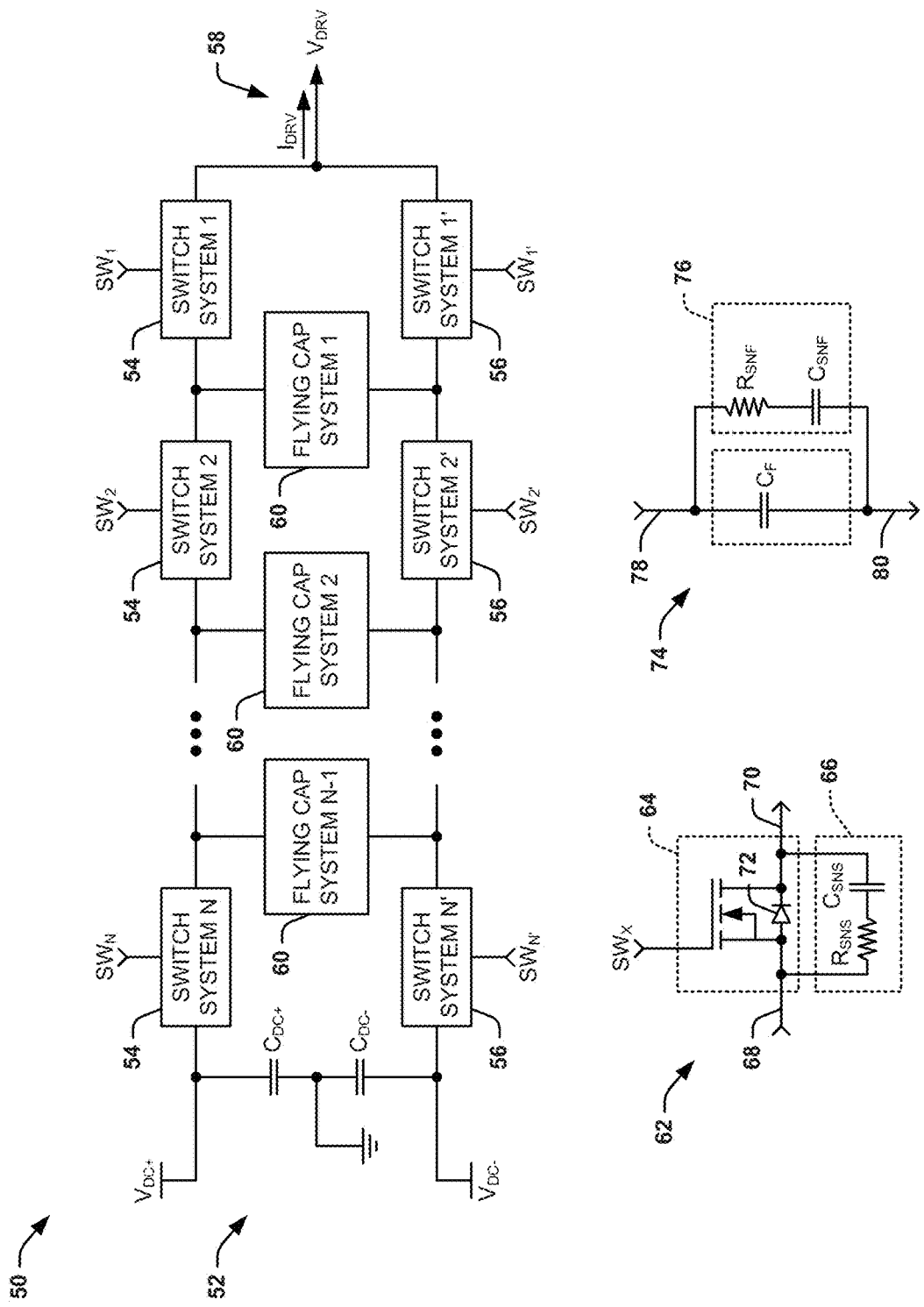
FIG. 2 illustrates an example diagram of a half-bridge switching circuit system.

FIG. 2 illustrates an example diagram 50 of a half-bridge switching system. The diagram 50 demonstrates a half-bridge switching circuit 52 that can correspond to the half-bridge switching system 10 in the example of FIG. 1. Therefore, reference is to be made to the example of FIG. 1 in the following description of the example of FIG. 2.

The half-bridge switching circuit 52 includes a cascaded arrangement of switch systems 54 and complementary switch systems 56. The switch systems 54 are arranged between a positive rail voltage $V_{DC+}$ (e.g., approximately 350 VDC) and an output 58 and the complementary switch systems 56 are arranged between a negative rail voltage $V_{DC-}$ (e.g., approximately −350 VDC) and the output 58. The switch systems 54 and the complementary switch systems 56 are thus arranged as complementary pairs having a quantity N stages, and are thus demonstrated as "SWITCH SYSTEM 1" through "SWITCH SYSTEM N" and "SWITCH SYSTEM 1'" through "SWITCH SYSTEM N'", respectively, where N is a positive integer. The $N^{th}$ stage of the switch systems 54 is coupled to the positive rail voltage $V_{DC+}$ and is separated from ground via a capacitor $C_{DC+}$, and the Nth stage of the complementary switch systems 56 is coupled to the negative rail voltage $V_{DC-}$ and is separated from ground via a capacitor $C_{DC-}$. The switch systems 54 are controlled via respective switching signals $SW_1$ through $SW_N$ (collectively "SW"), while the complementary switch systems 56 are controlled via respective switching signals $SW_{1'}$ through $SW_{N'}$ (collectively "SW'"), respectively.

The half-bridge switching circuit 52 also includes a plurality of flying capacitor systems 60 that interconnect the nodes between the switch systems 54 and the complementary switch systems 56. Thus, the flying capacitor systems 60 are likewise arranged in a cascaded sequence, and are thus demonstrated as "FLYING CAP SYSTEM 1" through "FLYING CAP SYSTEM N−1" in the example of FIG. 2. The flying capacitor systems 60 can include one or more capacitors (in parallel and/or series arrangements) that behave as a capacitor. The voltage across FLYING CAP SYSTEM M is nominally controlled to have a value of $M*(V_{DC+}-V_{DC-})/N$, where M corresponds to a given one of the N−1 flying capacitor systems 60. For an example of a 700 volt DC bus and N=11, the voltage across FLYING CAP SYSTEM 1 is 63.6 V, such that the voltage across FLYING CAP SYSTEM 2 is 127.2 V, etc. The nominal voltage across any of the switch systems 54 is the voltage across two neighboring FLYING CAP SYSTEMs, which is 63.6 V in the previous example. The number N of stages can thus correspond to a desired quantization of the output voltage $V_{DRV}$, with N+1 discrete voltage levels available, namely $V_{DC+}$, $V_{DC-}$, and N−1 evenly spaced voltage levels therebetween. For the example of a 700 volt DC bus and N=11, the 12 available hard-switched voltage levels are separated by approximately 63.6 volts. To which amplitude of the N+1 voltage levels the output voltage $V_{DRV}$ is provided is based on the selective complementary activation of the switch systems 54 and the complementary switch systems 56 via the switching signals SW and SW'.

In the example of FIG. 2, a given SWITCH SYSTEM M and a given SWITCH SYSTEM M' form a complementary pair controlled with mutually exclusive activation (e.g., with a controlled dead-time between deactivation of one and activation of the other). Accordingly, the current $I_{DRV}$ is provided at the output 58 to the motor (e.g., the motor 12), with the selective activation of the switch systems 54 and the complementary switch systems 56 defining an amplitude of the associated output voltage $V_{DRV}$. As an example, the selective complementary activation of the switch systems 54 and the complementary switch systems 56 can be such that a delay is provided between deactivation of one of the switch systems 54 and the complementary switch systems 56 and activation of the other of the switch systems 54 and the complementary switch systems 56 to substantially mitigate the occurrence of a shoot-through current.

In the example of FIG. 2, the diagram 50 demonstrates an example of a switch system 62 that can correspond to one of the switch systems 54 and/or complementary switch systems 56. As an example, all of the switch systems 54 and the complementary switch systems 56 can be arranged substantially identically, and can be configured substantially similar to the switch system 62. The switch system 62 includes a metal-oxide semiconductor field-effect transistor (MOSFET) switch 64 and a snubber circuit 66 that is arranged in parallel with the MOSFET switch 64 between a first terminal 68 and a second terminal 70 (e.g., first and second nodes, respectively). As an example, the MOSFET switch 64 can be configured as a GaN MOSFET. The MOSFET switch 64 is controlled by a switching signal $SW_X$ that can correspond to any of the switching signals $SW_1$ through $SW_N$ or any of the switching signals $SW_{1'}$ through $SW_{N'}$. The MOSFET switch 64 includes a body-diode 72 that may provide conduction of the current $I_{DRV}$ during deactivation of the complementary MOSFET, such as to provide a path for the current $I_{DRV}$ prior to the switch 64 being activated as a synchronous rectifier to reduce losses. The orientation of the MOSFET switch 64 when used as one of the switch systems 54 or 56 is such that when deactivated, the flying capacitor systems 60 cannot discharge. The snubber circuit 66 includes a series connection of a resistor $R_{SNS}$ and a capacitor $C_{SNS}$ between the first terminal 68 and the second terminal 70. Although the switch system 62 is shown with a single MOSFET and single series RC snubber, alternative arrangements with a plurality of MOSFETs in parallel and snubber circuits in parallel is understood to be within the scope of the systems described herein.

In addition, the diagram 50 demonstrates an example of a flying capacitor system 74 that can correspond to one of the flying capacitor systems 60. As an example, all of the flying capacitor systems 60 can be arranged substantially identically. The flying capacitor system 74 includes a flying capacitor $C_F$ and a snubber circuit 76 that is arranged in parallel with the flying capacitor $C_F$ between a first terminal 78 and a second terminal 80 (e.g., first and second nodes, respectively). Similar to as described previously regarding the snubber circuit 66, the snubber circuit 76 includes a series connection of a resistor $R_{SNF}$ and a capacitor $C_{SNF}$ between the first terminal 78 and the second terminal 80. Although the snubber circuit 76 is shown as a single series RC, alternative arrangements with many RC circuits in parallel is understood to be within the scope of the systems described herein.

The snubber circuits 66 and 76 can thus be configured to substantially mitigate the overvoltage across terminals 68 and 70 of the MOSFET switch 64 in the switch system 62 during switching transitions. As a result, the respective snubber circuits 66 and 76 can be implemented to substantially mitigate damage to the MOSFET switch 64 associated with each of the switch systems 54 and complementary switch systems 56 during operation of the motor driver system 14. Additionally, the snubber circuits 66 and 76 can also facilitate more rapid switching speeds of the MOSFET switch 64 to implement very high switching of the switch systems 54 and the complementary switch systems 56. Accordingly, the snubber circuits 66 and 76 can provide circuit protection and facilitate faster operation of the motor driver system 14.

Figure 3:
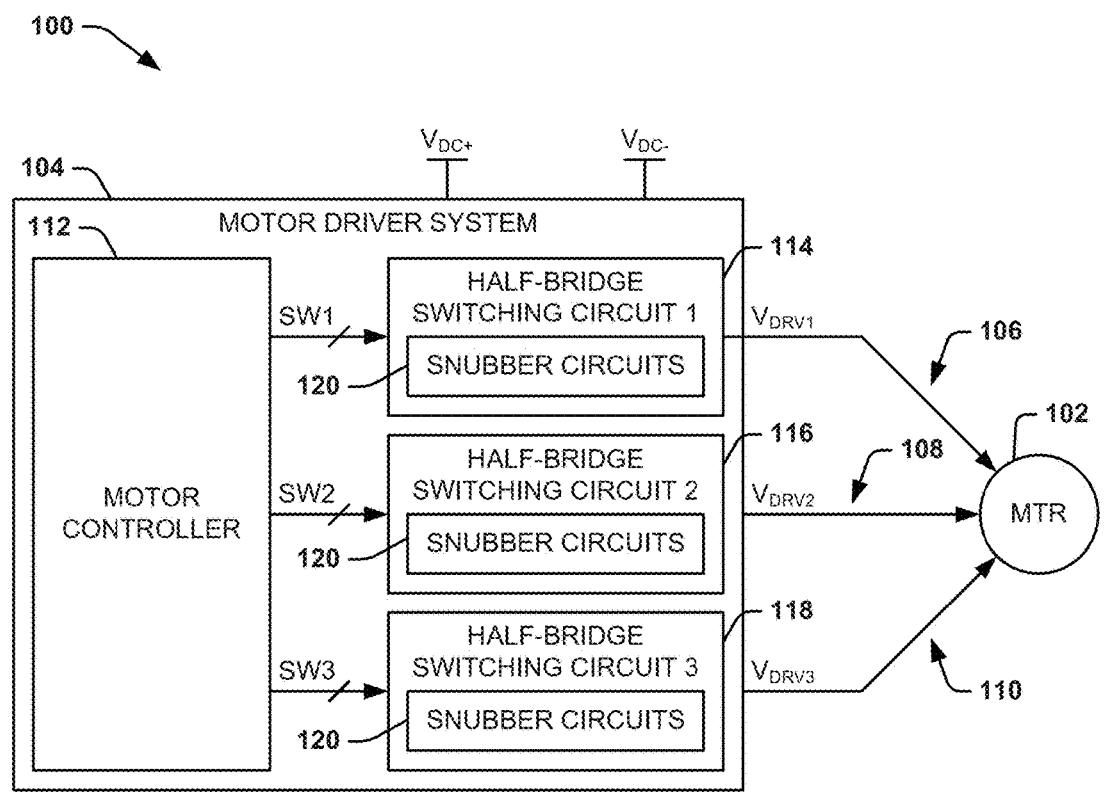
FIG. 3 illustrates another example of a motor system.

FIG. 3 illustrates another example of a motor system 100. The motor system 100 can be implemented in any of a variety of motor control applications to control the speed and/or torque of a motor 102. In the example of FIG. 3, the motor 102 can be configured as a three-phase motor. The motor system 100 includes a motor driver system 104 that is configured to generate a first output voltage $V_{DRV1}$ at a first output 106, a second output voltage $V_{DRV2}$ at a second output 108, and a third output voltage $V_{DRV3}$ at a third output 110. Each of the outputs 106, 108, and 110 are coupled to the motor 102, and thus the output voltages $V_{DRV1}$, $V_{DRV2}$, and $V_{DRV3}$ each correspond to separate respective phases of the three-phase motor 102. Accordingly, the output voltages $V_{DRV1}$, $V_{DRV2}$, and $V_{DRV3}$ are provided to the motor 102 to control the speed and/or torque of the motor 102. In the example of FIG. 3, the motor driver system 104 can be configured to generate each of the output voltages $V_{DRV1}$, $V_{DRV2}$, and $V_{DRV3}$ based on a differential voltage $V_{Dc}$, demonstrated as a positive rail voltage $V_{DC+}$ and a negative rail voltage $V_{DC-}$, similar to as demonstrated previously in the example of FIG. 2.

In the example of FIG. 3, the motor driver system 104 includes a motor controller 112 that is configured to generate a first set of switching signals SW1, a second set of switching signals SW2, and a third set of switching signals SW3. Additionally, the motor driver system 104 includes a first half-bridge switching circuit 114, a second half-bridge switching circuit 116, and a third half-bridge switching circuit 118. The first half-bridge switching circuit 114 is configured to generate the first output voltage $V_{DRV1}$ based on the first set of switching signals SW1, the second half-bridge switching circuit 116 is configured to generate the second output voltage $V_{DRV2}$ based on the second set of switching signals SW2, and the third half-bridge switching circuit 118 is configured to generate the third output voltage $V_{DRV3}$ based on the third set of switching signals SW3.

Therefore, the motor controller 112 can control the output voltages $V_{DRV1}$, $V_{DRV2}$, and $V_{DRV3}$ via the respective switching signals SW1, SW2, and SW3 and the respective half-bridge switching circuits 114, 116, and 118 to control the motor 102 (e.g., based on amplitude variations of the output voltages $V_{DRV1}$, $V_{DRV2}$, and $V_{DRV3}$ at 120° respective phase-delays).

Each of the half-bridge switching circuits 114, 116, and 118 can be configured substantially similar to the half-bridge switching circuit 52 in the example of FIG. 2, and can thus include a set of switches and a complementary set of switches, as well as an associated set of flying capacitors. Thus, the set of switches and a complementary set of switches can be selectively activated in a complementary manner via the respective set of the switching signals SW1, SW2, and SW3 to generate the respective output voltages $V_{DRV1}$, $V_{DRV2}$, and $V_{DRV3}$ based on the rail voltages $V_{DC+}$ and $V_{DC-}$. For example, the sets of switches and complementary switches can be configured as GaN MOSFETs.

In addition, in the example of FIG. 3, each of the switching circuits 114, 116, and 118 also includes snubber circuits 120. As an example, the snubber circuits 120 can each be configured substantially similar to the snubber circuits 66 and 74 in the example of FIG. 2, and can thus be configured as a series arrangement of a capacitor and a resistor that is arranged in parallel with the switches, the complementary switches, and the flying capacitors. The snubber circuits 120 can thus be configured to substantially reduce the voltage overshoot at the terminals of the switches and the complementary switches during switching transitions. As a result, the snubber circuits 120 can be implemented to substantially mitigate damage to the switches and the complementary switches during operation of the motor driver system 104. Additionally, by reducing the overvoltage at the terminals of the switches and the complementary switches the snubber circuits 120 can also facilitate more rapid switching speeds of the switches and the complementary switches.

While the example of FIG. 3 is described with respect to a three-phase motor control system, it is to be understood that the motor system 100 can be implemented in other motor control systems, and thus may implement any number of half-bridge switching systems. Additionally, while the description herein of the motor system 100 describes the manner of generating the output voltages $V_{DRV}$ to drive a motor, the principles and concepts described herein can apply equally when power is flowing in reverse, e.g., when the motor shaft is driven by another energy source, such as wind, water, or another energy source, as a generator, and the voltages $V_{DRV}$ is used to control the amount of power taken from the generator. Therefore, as described herein, the term "motor" is used to describe a motor that turns in response to the output voltage $V_{DRV}$, but can also be used to describe a generator that is configured to generate electricity.

Figure 4:
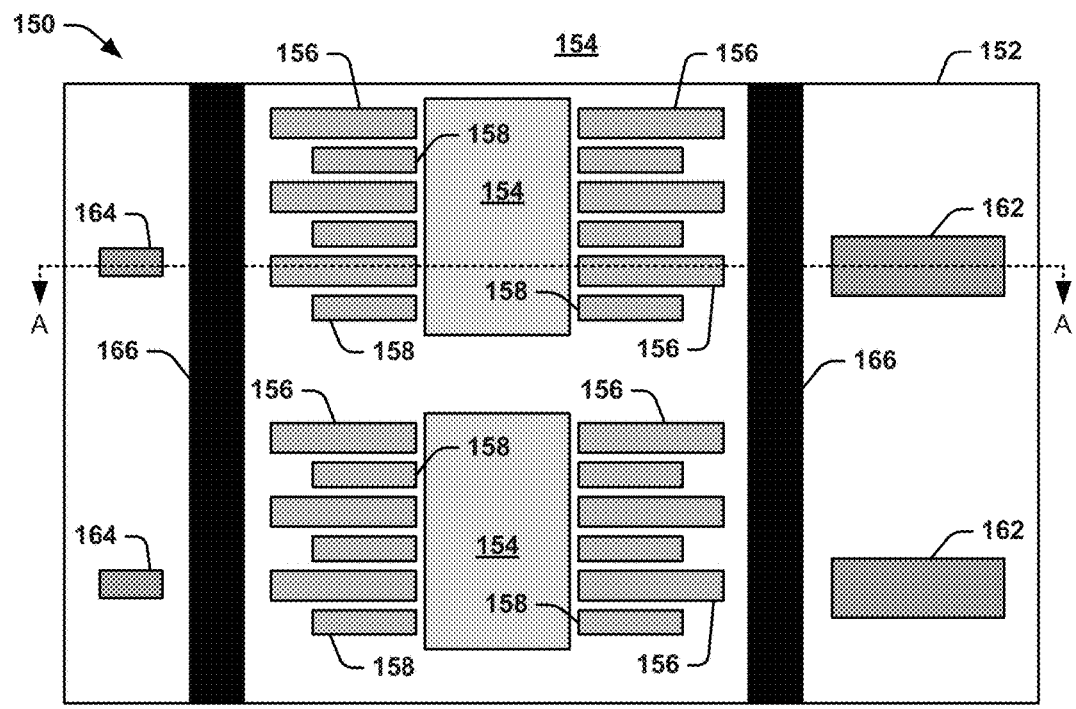
FIG. 4 illustrates an example diagram of a circuit layout.
Figure 5:
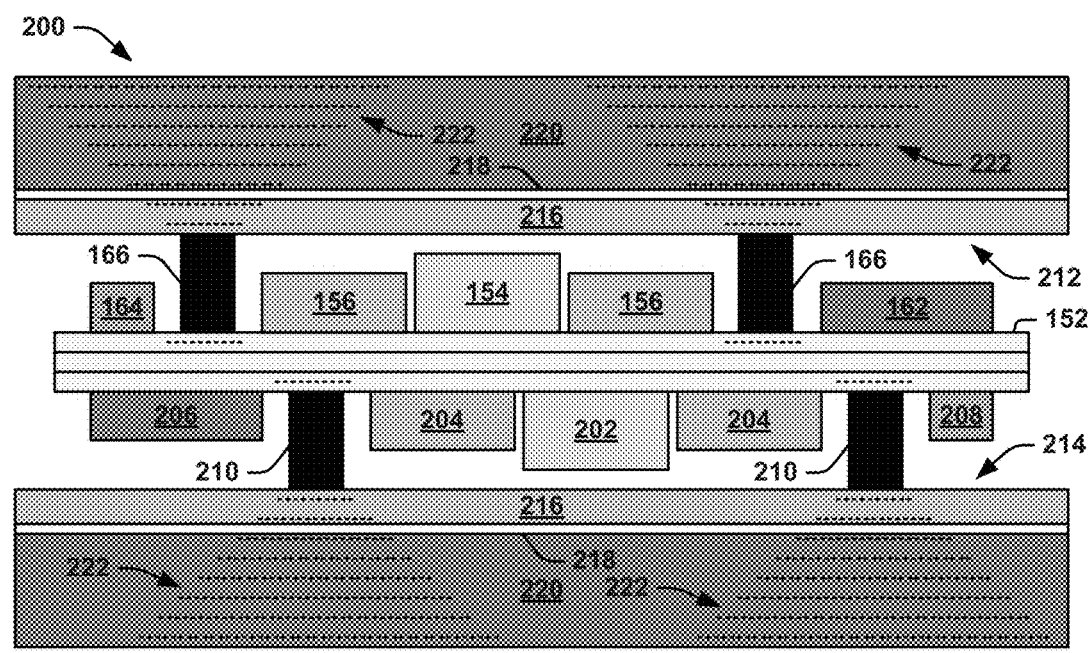
FIG. 5 illustrates another example diagram of a circuit layout.

FIG. 4 and FIG. 5 illustrate example diagrams 150 and 200 of a portion of a circuit layout. The circuit layout of FIG. 4 can correspond to a top-view of a printed circuit board (PCB) 152 on which a half-bridge switching circuit is fabricated. FIG. 5 shows a cross-sectional view of a portion of the circuit in the example of FIG. 4 taken along the dashed line "A". As an example, the PCB 152 can be a four-layer, double-sided PCB on which the components of the half-bridge switching circuit are mounted and wired. As an example, the half-bridge switching circuit can correspond to the half-bridge switching circuit 52 in the example of FIG. 2 and/or one of the half-bridge switching circuits 114, 116, and 118 in the example of FIG. 3.

The diagram 150 can correspond to a portion of the half-bridge switching circuit, such that additional parts of the half-bridge switching circuit can extend in any direction beyond the demonstrated boundaries of the PCB 152. The diagram 150 demonstrates a plurality of MOSFET switches 154 and a plurality of capacitors 156 and a plurality of resistors 158 that correspond to respective snubber circuits across the MOSFET switches 154. In the example of FIG. 4, the capacitors 156 and the resistors 158 are interleaved with respect to each other (not all have reference numbers for clarity of illustration). As an example, each of the MOSFET switches 154 can include multiple interleaved drain and source terminals, such that an associated snubber circuit (e.g., the snubber circuit 66 in the example of FIG. 2) can include a plurality of series connections of the capacitors 156 and the resistors 158 that are all arranged in parallel with a respective one of the MOSFET switches 154.

The cross-sectional view in the diagram 200 in the example of FIG. 5 demonstrates that the other side of the double-sided PCB 152 can be arranged similar, with similar components, including complementary MOSFET switches 202. The diagrams 150 and 200 also demonstrate a plurality of capacitors 162 (206) and a plurality of resistors 208 (164) that correspond to respective snubber circuits across the terminals of the flying capacitors. The flying capacitors are not shown in the example of FIGS. 4 and 5, but the terminals of each of the flying capacitors are routed on adjacent conductive layers of the double-sided PCB 152. One example of a four-layer arrangement of the double-sided PCB 152 can be such that the terminals of each of the flying capacitor systems are routed on the inner two layers of the double-sided PCB 152. For example, a given one of the flying capacitors can be conductively coupled to one of the MOSFET switches 154 and a respective one of the MOSFET switches 202 via a first conductive layer and a second conductive layer that is adjacent to the first conductive layer, respectively, of the double-sided PCB 152. In addition, the capacitance of each of the flying capacitor systems may be divided such that one half of the capacitance can be connected to one edge of the double-sided PCB 152 and the other half of the capacitance can be connected to the other edge of the double-sided PCB 152. The capacitor current is then split, with one half of the capacitor current being provided to one edge of the double-sided PCB 152 and the other half of the capacitor current being provided to the other edge of the double-sided PCB 152. Such an arrangement reduces the total stray inductance in series with each of the flying capacitor systems. In the example of FIG. 4, while the snubber circuit associated with each of the flying capacitors includes a single capacitor 162 and a single resistor 208, it is to be understood that the corresponding snubber circuit (e.g., the snubber circuit 74 in the example of FIG. 2) can include multiple series connections of the capacitors 162 and the resistors 208 that are all arranged in parallel with a respective one of the flying capacitors.

The diagrams 150 and 200 also demonstrate a set of thermally-conductive components 166 that extend along the surface of the PCB 152. As an example, the thermally-conductive components 166 can be formed from copper, aluminum, or a variety of other materials that are highly conductive of heat. The thermally-conductive components 166 may also take on shapes other than the straight bars shown in diagrams 150 and 200. As described in greater detail herein, the associated half-bridge switching system can be formed such that a T-clad material can be coupled to the thermally-conductive components 166 to provide efficient heat dissipation of the half-bridge switching circuit that is mounted to the PCB 152.

As described previously, the PCB 152 can be formed as a four-layer double-sided PCB, and can thus include circuit components coupled to an underside of the double-sided PCB 152 relative to the top-view of the double-sided PCB 152 in the example of FIG. 4. As an example, the MOSFET switches 154 can correspond to the switch systems 54 in the half-bridge switching circuit 52 while the MOSFET switches 202 can correspond to the complementary switch systems 56 of the half-bridge switching circuit 52 which can be mounted to an opposite surface of the double-sided PCB 152 in a manner similar to the MOSFET switches 154. Snubber circuits can be placed adjacent to MOSFET switches 202 in a manner similar to how snubber circuits formed by the capacitors 156 and the resistors 158 are placed adjacent to MOSFET switches 154. As another example, the double-sided PCB 152 can also include snubber circuits formed by the capacitors 162 and the resistors 208 for one flying capacitor and by capacitors 206 and resistors 164 for another flying capacitor. Furthermore, the double-sided PCB 152 can also include one or more thermally-conductive components 210 mounted on the opposite surface. Therefore, the double-sided PCB 152 can be arranged substantially similar to the arrangement demonstrated in the diagrams 150 and 200.

Similar to the diagram 150, the diagram 200 demonstrates the PCB 152 as a four-layer, double-sided PCB on which the components of the half-bridge switching circuit are mounted and wired. The diagram 200 demonstrates a MOSFET switch 154 and a plurality of capacitors 156 that correspond to a portion of the respective snubber circuit across the MOSFET switch 154 (e.g., along with the resistors 158 in the diagram 150 of the example of FIG. 4). The diagram 200 also demonstrates a MOSFET switch 202 and a plurality of capacitors 204 that correspond to a portion of the respective snubber circuit across the MOSFET switch 202 on an opposite surface of the double-sided PCB 152 relative to the MOSFET switch 154 and the capacitors 156. The MOSFET switch 202 and the capacitors 204 can correspond to one of the complementary switch systems of the associated half-bridge switching circuit (e.g., a complementary switch system 56 of the half-bridge switching circuit 52).

The diagram 200 also demonstrates the set of thermally-conductive components 166 on the first surface of the double-sided PCB 152 and a set of thermally-conductive components 210 on the opposite surface of the double-sided PCB 152. Each of the thermally-conductive bars 166 and 210 extend along the surface of the PCB 152. In the example of FIG. 5, a first T-clad material arrangement 212 is coupled to the thermally-conductive components 166 and a second T-clad material arrangement 214 is coupled to the thermally-conductive components 210. Each of the T-clad material arrangements 212 and 214 can include a first conductive layer 216 (e.g., copper) that is coupled (e.g., soldered) to the respective thermally-conductive components 166 and 210 (e.g., along an entirety of the length of the respective thermally-conductive components 166 and 210). Each of the T-clad material arrangements 212 and 214 also includes a thin electrically-insulating thermally-conductive layer 218 (e.g., ceramic) and a relatively thicker second conductive layer 220 (e.g., aluminum) that is coupled to the thin electrically-insulating thermally-conductive layer 218.

Based on the arrangement of the T-clad material arrangements 212 and 214, heat generated by the associated half-bridge switching circuit can be efficiently dissipated. Heat that is generated via the circuit components on the double-sided PCB 152 (e.g., the MOSFET switches 154 and 202, the capacitors 156, 162, and 204, the resistors 158 and 164, etc.) can be conducted through metallic layers of PCB 152 and into the thermally-conductive components 166 and 210. The heat can then be spread into the T-clad layer 216, across the insulating layer 218 and into the thick heat-spreading layers 220, as demonstrated diagrammatically in the example of FIG. 5 by the dashed lines 222. In addition, as an example, the thick heat-spreading layers 220 can be held at a lower temperature by external means (e.g. air or liquid convection). Therefore, based on the mounting of the electronic components of the half-bridge switching circuit to both surfaces of the double-sided PCB 152, and based on the coupling of the T-clad material arrangements 212 and 214 to the double-sided PCB 152 via the respective thermally-conductive components 166 and 210, the heat that is generated by the electronic components of the half-bridge switching circuit can be efficiently dissipated.

It is to be understood that the arrangement of the circuit components with respect to the double-sided PCB 152 in the examples of FIGS. 4 and 5 is provided by example only. It is to be understood that the components demonstrated in the diagrams 150 and 200 are not necessarily illustrated to scale, and are demonstrated merely to provide an exemplary relative layout of the associated components. Additionally, the layout of the circuit components in the diagrams 150 and 200 are provided as but one example. Furthermore, the use of a T-clad material arrangement to provide cooling for a circuit system is not limited to being implemented in half-bridge switching circuit depicted in the diagrams 150 and 200, but can be implemented in combination with thermally-conductive components in any of a variety of surface-mount technology (SMT) circuit systems in which efficient cooling is desired, either on one or both sides of a PCB. Thus, it is to be understood that the arrangement of the circuit components in the diagrams 150 and 200 can be provided in any of a variety of ways on the double-sided PCB 152 (or a single-sided PCB) to provide substantially optimal space-savings and heat-dissipation, as described herein.

Figure 6:
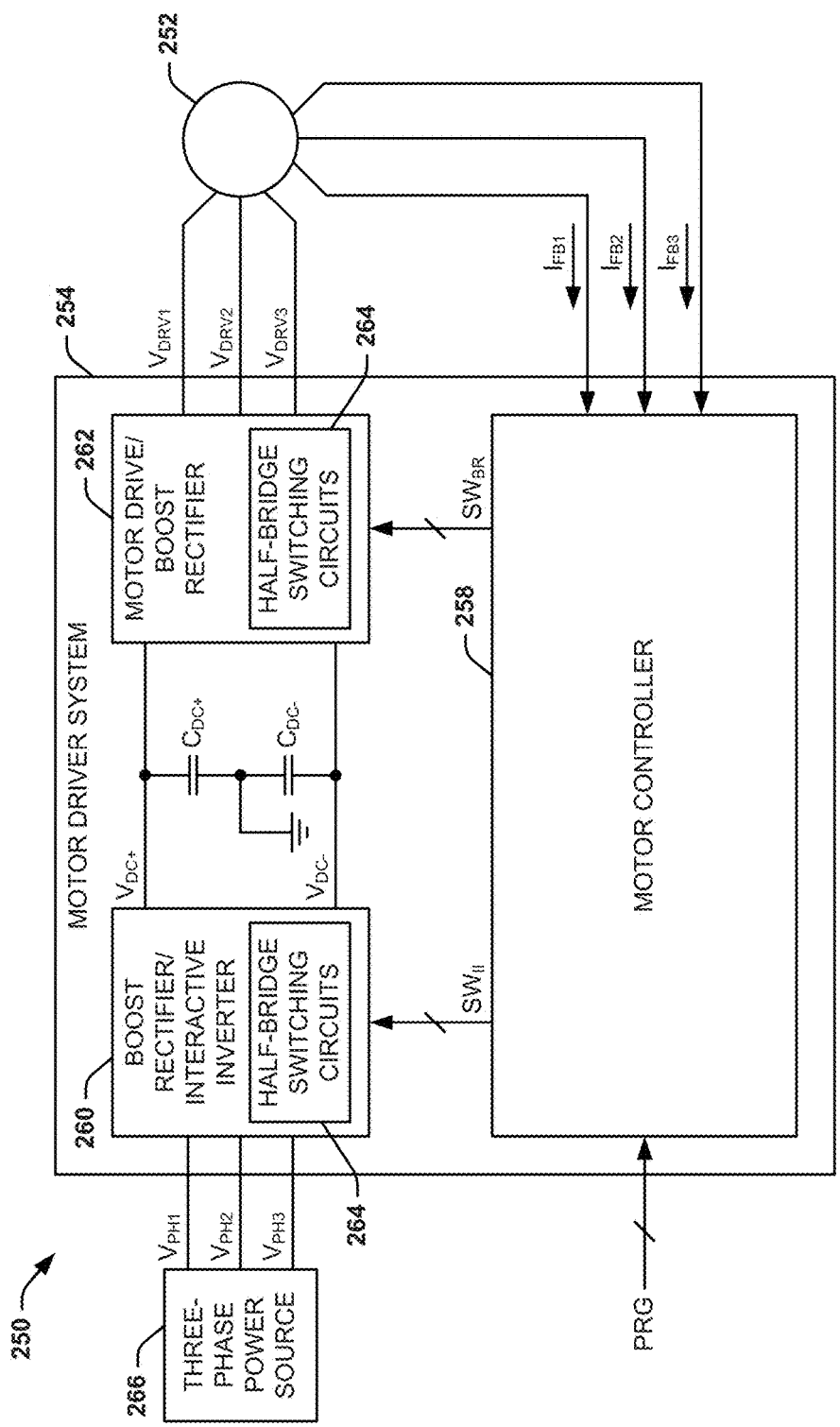
FIG. 6 illustrates yet another example of a motor system.

FIG. 6 illustrates yet another example of a motor system 250. The motor system 250 can be implemented in any of a variety of motor control applications to control the speed and/or torque of a motor 252. In the example of FIG. 6, the motor 252 can be configured as a three-phase motor. The motor system 250 includes a motor driver system 254 that is configured to generate a first output voltage $V_{DRV1}$, a second output voltage $V_{DRV2}$, and a third output voltage $V_{DRV3}$. Each of the output voltages $V_{DRV1}$, $V_{DRV2}$, and $V_{DRV3}$ correspond to separate respective phases provided to control the three-phase motor 252. Accordingly, the output voltages $V_{DRV1}$, $V_{DRV2}$, and $V_{DRV3}$ are provided to the motor 252 to control the speed and/or torque of the motor 252.

In the example of FIG. 6, the motor driver system 254 includes a motor controller 258, a boost rectifier/interactive inverter 260, and a motor drive/boost rectifier 262. Each of the boost rectifier/interactive inverter 260 and the motor drive/boost rectifier 262 includes three half-bridge switching circuits 264, with each of the half-bridge switching circuits 264 corresponding to a separate phase of the three-phase power of the motor system 250. When power is flowing from the three-phase power source 266 to the motor 252, power stage 260 is controlled as a boost rectifier and power stage 262 is controlled as a variable-speed motor drive. When power is flowing from a generator 252 back to the three-phase power source 266, power stage 262 is controlled as a boost rectifier and power stage 260 is controlled as a utility-interactive inverter. As an example, each of the half-bridge switching circuits 264 in power stages 260 and 262 can be arranged substantially similar to the half-bridge switching circuit 52 in the example of FIG. 2, and can thus include snubber circuits in parallel with each MOSFET switch, each complementary MOSFET switch, and each flying capacitor. In the example of FIG. 6, the boost rectifier/interactive inverter 260 receives a three-phase voltage, demonstrated as $V_{PH1}$, $V_{PH2}$, and $V_{PH3}$, from a three-phase power source 266, and is configured to generate a positive rail voltage $V_{DC+}$ and a negative rail voltage $V_{DC-}$ from the three-phase voltage $V_{PH1}$, $V_{PH2}$, and $V_{PH3}$ based on a set of switching signals $SW_{II}$. Similar to as described previously in the example of FIG. 2, the positive rail voltage $V_{DC+}$ is separated from ground via a capacitor $C_{DC+}$ and the negative rail voltage $V_{DC-}$ is separated from ground via a capacitor $C_{DC-}$. As an example, the ground reference shown is an arbitrary choice that minimizes the voltage relative to ground for any phase of the motor or three-phase power source, but other ground references may be chosen. The motor drive/boost rectifier 262 is configured to generate each of the output voltages $V_{DRV1}$, $V_{DRV2}$, and $V_{DRV3}$ based on the positive rail voltage $V_{DC+}$ and the negative rail voltage $V_{DC-}$, similar to as described previously in the example of FIG. 2, in response to switching signals $SW_{BR}$.

The motor controller 258 is configured to generate the switching signals $SW_{II}$ and $SW_{BR}$ that are provided to the boost rectifier/interactive inverter 260 and the motor drive/boost rectifier 262, respectively. In addition, the motor controller 258 is demonstrated as receiving a plurality of feedback currents $I_{FB1}$, $I_{FB2}$, and $I_{FB3}$ that can correspond, respectively, to the three-phases of the motor 252. As an example, the feedback currents $I_{FB1}$, $I_{FB2}$, and $I_{FB3}$ can be indicative of angle of rotation of the motor 252 (e.g., such as in encoder implementations or other applications that may require angular feedback of rotation of the motor 252). The feedback currents $I_{FB1}$, $I_{FB2}$, and $I_{FB3}$ can also correspond to the switching control scheme defined by the switching signals $SW_{II}$ and/or $SW_{BR}$, such that the output voltages $V_{DRV1}$, $V_{DRV2}$, and $V_{DRV3}$ can be generated based on information associated with the feedback currents $I_{FB1}$, $I_{FB2}$, and $I_{FB3}$.

Furthermore, as another example, the motor controller 258 can be at least partially based on a single programmable device (e.g., a SoC FPGA) which contains at least one processor core surrounded by a large amount of programmable logic, that can be programmed with respect to the control scheme of the generation of the switching signals $SW_{II}$ and $SW_{BR}$. In the example of FIG. 6, the motor controller 258 receives a set of programming signals PRG that can be provided from a computer system, such as via a peripheral connection. For example, the programming signals PRG can be provided via a universal serial bus (USB), a serial port, or other external connection means. The program may be updated in the field based on the programming signals PRG. Therefore, the motor controller 258 can be programmable to provide the switching signals $SW_{II}$ and/or the switching signals $SW_{BR}$ in a predetermined control scheme for generating the rail voltages $V_{DC+}$ and $V_{DC-}$ and/or the output voltages $V_{DRV1}$, $V_{DRV2}$, and $V_{DRV3}$, such as based on the feedback currents $I_{FB1}$, $I_{FB2}$, and $I_{FB3}$.

Accordingly, the motor driver system 254 can be implemented to include snubber circuits to substantially mitigate damage to the switches in the half-bridge switching circuits 264 during operation of the motor driver system 254. Additionally, by reducing the voltage across the terminals of the switches in the half-bridge switching circuits 264, the snubber circuits can also facilitate more rapid switching speeds of the switches, such as to implement the very high switching speeds, similar to as described previously. Furthermore, the half-bridge switching circuits 264 can each be mounted to a double-sided PCB, such as demonstrated in the diagrams 150 and 200 in the examples of FIGS. 4 and 5. The half-bridge switching circuits 264 can thus be arranged between T-clad material arrangements coupled to thermally-conductive bars on the double-side PCB, such as demonstrated in the diagrams 150 and 200 in the examples of FIGS. 4 and 5, to provide more efficient heat dissipation of the half-bridge switching circuits 264.

Figure 7:
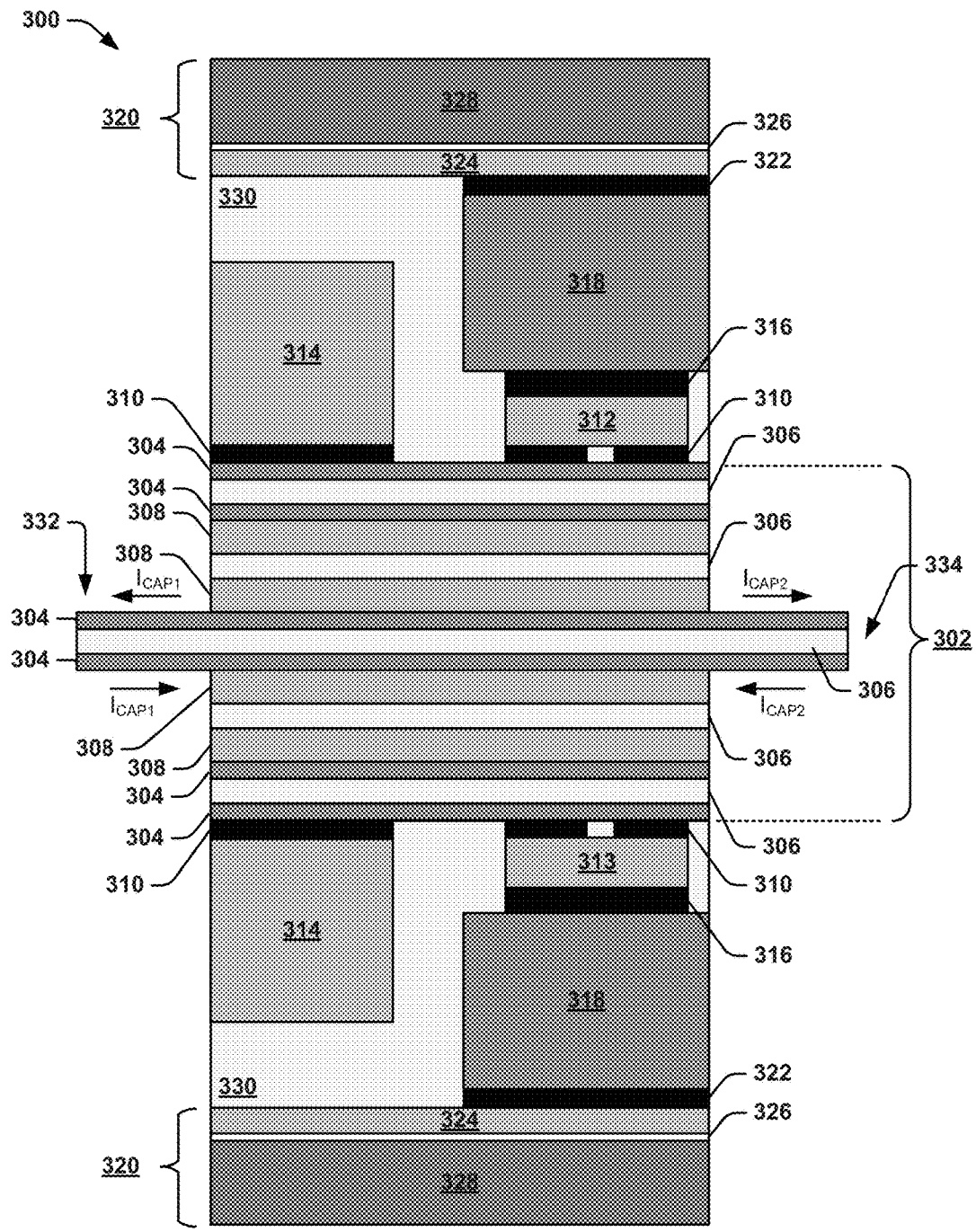
FIG. 7 illustrates an example of a cross-sectional view of a circuit layout.

FIG. 7 illustrates an example of a cross-sectional diagram 300 of a circuit. FIG. 7 shows a possible way the layers of the construction are stacked relative to one another and is not meant to be to scale. The diagram 300 can correspond to another example of the half-bridge switching system 10 in the example of FIG. 1. Therefore, reference is to be made to the example of FIGS. 1-3 in the following description of the example of FIG. 7. In the example of FIG. 7, the cross-sectional view of the diagram 300 corresponds to a cross-section that is orthogonal to the cross-sectional view demonstrated in the example of FIG. 5 with respect to the direction that the switch systems are placed and the flow direction of the capacitor currents.

The diagram 300 demonstrates a double-sided multilayer PCB 302. The double-sided multilayer PCB 302 is demonstrated as a six-layer PCB in the example of FIG. 7, with each of the layers including a conductive layer 304 (e.g., copper). However, the double-sided multilayer PCB 302 is not limited to six layers, but can instead implement more or less (e.g., four). As an example, each of the conductive layers 304 can have a thickness of approximately 70 μm. Each of the conductive layers 304 is demonstrated as being separated from an adjacent conductive layer 304 by a polymer layer 306, such as polyimide (e.g., Kapton). As an example, the polymer layer 306 can provide a significant insulation barrier between the conductive layers 304, such as in a high-voltage application. For example, the double-sided PCB 302 can be implemented in a high-voltage motor driver circuit application, such as to drive high-voltage AC motors (e.g., an approximately 5 kV bus). As an example, the polymer layers 306 that interconnect respective pairs of the conductive layers 304 can have a thickness of approximately 100 μm. In addition, the double-sided multilayer PCB 302 includes pre-preg layers 308 (e.g., uncured epoxy layers during construction that are cured to become rigid epoxy layers) that are arranged between pairs of the double-sided multilayer PCB 302 to secure the respective layers. As an example, the pre-preg layers 308 can have a thickness of approximately 100 μm, and the polymer layers 306 that interconnect respective pairs of the pre-preg layers 308 can have a thickness of approximately 50 μm.

As described previously, based on the inclusion of the polymer layers 306, the respective half-bridge switching system 10 can be configured to operate for high-voltage motor applications. For example, the motor driver system 254 that is configured to include half-bridge switching circuits 264 that implement the double-sided multilayer PCB 302 can receive three-phase voltages $V_{PH1}$, $V_{PH2}$, and $V_{PH3}$ and provide output voltages $V_{DRV1}$, $V_{DRV2}$, and $V_{DRV3}$ at high-voltages (e.g., approximately 5 kV). In other words, the insulating capability provided by the polymer layers 306 between the conductive layers 304 can provide sufficient protection to sustain a longer life of the associated half-bridge switching system 10, as opposed to insulating between the conductive layers 304 with only pre-preg layers 308. However, it is to be understood that, for lower voltage applications, the addition of the polymer layer 306 between pre-preg layers 308 can be omitted for a simpler construction. As an example, at any voltage, a polymer layer 306 can be provided between at least one pair of adjacent conductive layers 304 for purposes of carrying capacitor currents between the switch systems and the flying capacitor systems because the polymer layer 306 can be thinner than epoxy layers to achieve the same voltage withstand capability. It is to be understood that the arrangement with respect to the number of layers of the double-sided multilayer PCB 302 and the respective thicknesses of the conductive layers 304, the polymer layers 306, and the pre-preg layers 308 is provided solely by example. Therefore, other arrangements and thicknesses of the respective layers of the double-sided multilayer PCB 302 are possible for a given half-bridge switching system 10.

In the example of FIG. 7, electrical components are demonstrated as being soldered to the outer layers of the conductive layers 304 on both sides of the double-sided multilayer PCB 302, demonstrated by the solder 310. The electrical components are demonstrated in the diagram 300 as a MOSFET switch 312 mounted to one surface of the double-sided multilayer PCB 302 and a complementary switch 313 mounted to the other surface of the double-sided multilayer PCB 302. As an example, the complementary MOSFET switches (e.g., the MOSFET switches 312 and 313) can be mounted at an approximate same location on opposite sides of the double-sided multilayer PCB 302 (e.g., directly opposing each other). The electrical components also include other surface mount components 314, which could correspond to a resistor or a capacitor, such as associated with one of the snubber circuits 18. In the example of FIG. 7, the MOSFET switches 312 and 313 are demonstrated as having a metalized top-surface 316 (e.g., "top" with respect to a "bottom" that is soldered to the double-sided multilayer PCB 302), which can result from fabrication and/or can be conductively reinforced via additional solder. As an example, the MOSFET switches 312 and 313 with the "top-side" metallization could be fabricated as having either bare die or a chip-scale package metallization. As another example, the MOSFET switches 312 and 313 can be fabricated to facilitate coupling to separate conductive components to provide a metalized top-surface.

A thermally-conductive component 318 is coupled to the top surface of the respective MOSFET switches 312 and 313. As an example, the thermally-conductive components 318 can be formed from copper, aluminum, or a variety of other materials that are highly conductive of heat. The thermally-conductive components 318 may also take on shapes other than the columns shown in diagram 300 so that they can spread heat laterally to a larger area than the area of MOSFET switches 312 and 313. In the example of FIG. 7, T-clad material arrangements 320 are soldered to the respective thermally conductive components 318 via solder 322 on both sides of the double-side multilayer PCB 302. Thus, as an alternative to the example of FIG. 5 in which the thermally-conductive components 166 are coupled to the PCB 152, the thermally-conductive components 318 are coupled directly to the MOSFET switches 312 and 313 in the example of FIG. 7 to conduct heat from the MOSFET switches 312 and 313 to the respective T-clad material layer arrangements 320. As an example, the thermally-conductive components 318 may also be electrically conductive and have a shape that allows a soldered electrical connection from the outer surface 316 of the respective MOSFET switches 312 and 313 back to the surface of the double-side multilayer PCB 302.

Each of the T-clad material arrangements 320 can be configured substantially similar to the T-clad material arrangements 212 and 214 in the example of FIG. 5. For example, the T-clad material arrangements 320 can each include a first conductive layer 324 (e.g., copper) that is coupled (e.g., soldered) to the respective thermally-conductive components 318 via the solder 322, and also includes a thin electrically-insulating thermally-conductive layer 326 (e.g., ceramic) and a relatively thicker second conductive layer 328 (e.g., aluminum) that is coupled to the thin electrically-insulating thermally-conductive layer 326. Therefore, the T-clad material arrangements 320 can provide dissipation of heat generated by the respective MOSFET switches 312 and 313 via the respective thermally-conductive components 318. As described herein, the double-sided multilayer PCB 302 can include further heat dissipation capability, such as via heat-sink assemblies as described in greater detail herein.

Figure 8:
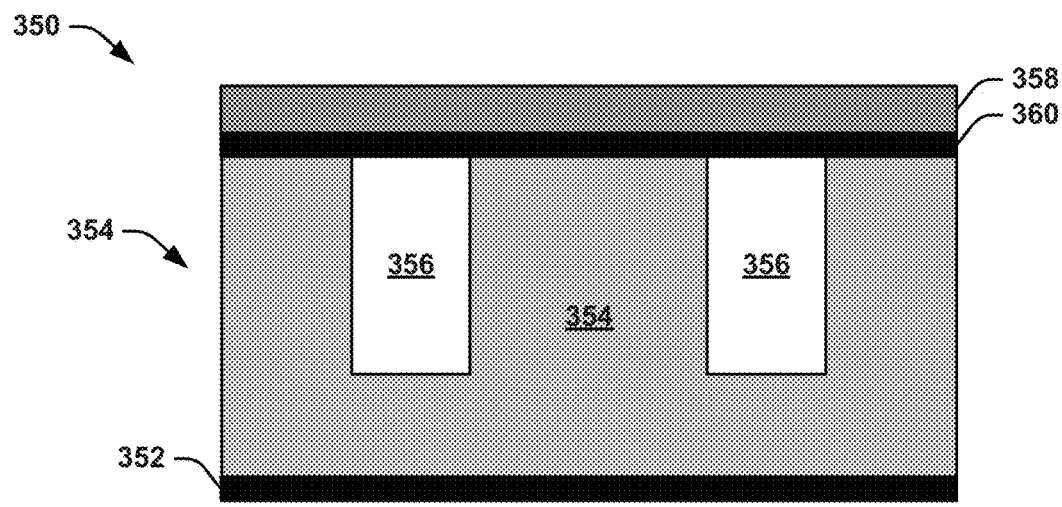
FIG. 8 illustrates an example of a cross-sectional view of a heat sink system.

FIG. 8 illustrates an example of a cross-sectional view of a heat-sink system 350. The heat-sink system 350 can correspond to a heat dissipation system that can be implemented with the double-sided multilayer PCB 302 in the example of FIG. 8. Therefore, reference is to be made to the example of FIG. 7 in the following description of the example of FIG. 8.

The heat-sink system 350 can be soldered to a T-clad material arrangement, such as the T-clad material arrangements 212 or 214 in the example of FIG. 5, or the T-clad material arrangements 320 in the example of FIG. 7. In the example of FIG. 8, the heat-sink system 350 includes solder 352 that can bond the heat-sink system 350 to conductive layer of a respective T-clad material arrangement (e.g., the second conductive layer 328 of the T-clad material arrangement 320 of the example of FIG. 7). The heat-sink system 350 also includes a thermally-conductive material (e.g., aluminum) 354 that includes liquid-conduction channels 356 that can be implemented for heat-exchange. The liquid-conduction channels 356 are demonstrated as being sealed by a metal cap 358 that is soldered 360 to the thermally-conductive material 364. As an example, with reference to the example of FIG. 7, once the heat has made it out to the second conductive layer 362 of the T-clad material arrangement 320, it is easier to remove the heat because the heat flux is smaller with larger areas. Additionally, by implementing liquid cooling via the liquid-conduction channels 356, the heat-sink system 350 can obtain thermal conduction coefficients approximately one-hundred times greater higher than with air alone. As an example, the liquid-conduction channels 356 can be achieved in other ways, such as via a cross-cut extrusion in the thermally-conductive material 364, such that the heat can then be removed from the liquid (e.g., water) to the air in an optimized radiator using conventional technology.

Referring back to the example of FIG. 7, two of the conductive layers 304 are demonstrated as being extended along at least one of the edges of the double-sided multilayer PCB 302, demonstrated as along both opposing edges in the cross-section of the diagram 300. The opposing edges are demonstrated as a first edge 332 and a second edge 334 that is opposite the first edge 332. As described previously, the capacitor current associated with the flying capacitors (capacitors not shown in the example of FIG. 7) that is provided through a given one of the MOSFET switches 312 and 313 is split approximately in half. In the example of FIG. 7, approximately one half of the capacitor current, demonstrated as $I_{CAP1}$, is provided approximately toward the first edge 332 of the double-sided multilayer PCB 302 and the approximately one half of the capacitor current, demonstrated as $I_{CAP2}$, is provided approximately toward the second edge 334 of the double-sided multilayer PCB 302. The capacitor currents $I_{CAP1}$ and $I_{CAP2}$ are demonstrated as flowing toward the edges 332 and 334 on a first of the extended conductive layers 304, and are demonstrated as returning from approximately the respective edges 332 and 334 via a second of the extended conductive layers 304 separated by a polymer layer 306.

In the example of FIG. 7, the capacitor currents $I_{CAP1}$ and $I_{CAP2}$ can each flow through a separate capacitor, with each of the separate capacitors collectively corresponding to a flying capacitor system (e.g., one of the flying capacitor systems 60). In this context a flying capacitor system 60, or the separate capacitors that comprise a flying capacitor system 60, can be a plurality of capacitors connected in parallel, in series, or a combination of parallel and series. Alternatively, the capacitor currents $I_{CAP1}$ and $I_{CAP2}$ can flow through different paths to the same flying capacitor system. For example, the separate respective capacitors can each provide approximately half the capacitance of the respective flying capacitor systems, such that approximately half of the capacitance of each of the flying capacitor systems 60 is coupled to each edge 332 and 334 of the double-sided multilayer PCB 302, as described previously. As an example, the flying capacitor systems 60, and thus the capacitors through which the capacitor currents $I_{CAP1}$ and $I_{CAP2}$ are provided can be located on a separate PCB (not shown). The current paths of the capacitor currents $I_{CAP1}$ and $I_{CAP2}$ can thus be provided in a manner that minimizes the round-trip loop area of the respective current flows of the capacitor currents $I_{CAP1}$ and $I_{CAP2}$. Accordingly, the arrangement of the capacitor currents $I_{CAP1}$ and $I_{CAP2}$ flowing to the half capacitance of the respective flying capacitor systems 60 at the respective edges 332 and 334 of the double-sided multilayer PCB 302 can substantially mitigate a total stray inductance in series with each of the flying capacitor systems 60.

As an example, the flying capacitor system 60 connections on the double-sided multilayer PCB 302 can be routed to the two conductive layers 304 that extend so that the flying-capacitor currents $I_{CAP1}$ and $I_{CAP2}$ flow out on the conductive layer 304 and return on the adjacent conductive layer 304 with a minimum separation of the polymer layer 306 set by a requirement to withstand the operating voltage over life of the half-bridge switching system. As an example, the electrical impedances seen by capacitor currents $I_{CAP1}$ and $I_{CAP2}$ can be matched and kept as small as possible. As an example, the connections can be kept as short and wide as possible to substantially minimize both electrical resistance in series with the flying capacitor systems 60 and the stray inductance in series with the respective capacitors. In addition, the connections between the double-sided multilayer PCB 302 and the respective capacitor boards can be provided on the edges 332 and 334 of the double-sided multilayer PCB 302, with each side having half of the total capacitance, as described previously. Alternatively, a flying capacitor system 60 may have two current paths in parallel which connect to currents $I_{CAP1}$ and $I_{CAP2}$ with impedances matched such that $I_{CAP1}$ and $I_{CAP2}$ are approximately equal. Therefore, the high-frequency impedance to the respective flying capacitor systems 60 can be reduced by approximately one half compared to connecting to the flying capacitor system 60 on only one side of the double-sided multilayer PCB 302. Each capacitor board may utilize a similar six-layer construction as the double-sided multilayer PCB 302 with the layout to the multiple capacitors being provided in the lowest-impedance manner. Each of the capacitor boards may also utilize a multilayer PCB, e.g., with more or less than six layers. As an example, for highest-frequency operation, the capacitor boards can be implemented with ceramic chip capacitors on both sides of each capacitor board. At lower frequencies, film capacitors may instead be used. The capacitor connections out of both edges of the PCB 302 (e.g., the edges 332 and 334) may connect back to a single capacitor board or to a plurality of capacitor boards. In either example, the capacitor currents $I_{CAP1}$ and $I_{CAP2}$ can each be approximately half of the total capacitor current.

As described herein, a switch system, such as the MOSFET switches 312 and 313, can be arranged as a single MOSFET or a plurality of MOSFETs in parallel. For example, in the example of FIG. 4, a switch system can be arranged as two parallel MOSFETs 154 placed adjacent to each other. As an example, for a given switch system "N", switch systems "N+1" and "N−1" would be placed further to the left and right of switch system N, respectively (not shown in the example of FIG. 4). A complementary switch system N' (labeled as switch system 202 in the example of FIG. 5) is placed on the opposite side of the PCB 152, such that the capacitor current can be carried on adjacent conductive layers of the PCB 152 as described earlier. In the example of FIG. 5, the capacitor current flows in and out of the plane of the figure (i.e., orthogonal to the "A" cross-section designated in FIG. 4) to be provided to the respective flying capacitor systems. Conversely, in the example of FIG. 7, the capacitor current flows left and right, as described in greater detail herein. In the example of FIG. 7, the MOSFET switch 312 corresponds to a MOSFET that is part of a switch system N, whereas the MOSFET switch 313 represents a MOSFET that is part of the complementary switch system N'. Therefore, in the example of FIG. 7, the switch systems N+1 and N−1 would be further into the plane of the page and further out of the plane of the page, respectively, relative to the switch system N (e.g., the MOSFET switch 312), and the capacitor current flows left and right to be provided to the flying capacitor systems.

Figure 9:
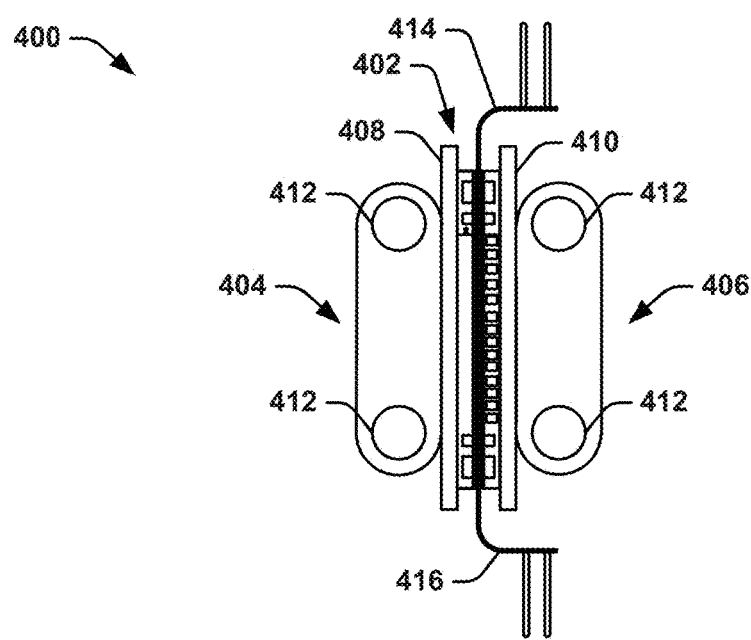
FIG. 9 illustrates an example of a circuit system.

FIG. 9 illustrates an example of a circuit system 400. The circuit system 400 can correspond to another example of the half-bridge switching system 10 in the example of FIG. 1. Therefore, reference is to be made to the example of FIGS. 1-3, as well as FIGS. 7 and 8, in the following description of the example of FIG. 9.

The circuit system 400 includes a double-sided multilayer PCB 402 on which the circuit components of the half-bridge switching circuit 10 are coupled. The circuit system 400 also includes a first heat-sink system 404 and a second heat-sink system 406 that are each coupled to the double-sided multilayer PCB 402 via respective T-clad material arrangements 408 and 410. Thus, the first heat sink 404 can correspond to a heat-sink system, similar to the heat-sink system 350 in the example of FIG. 8. Similarly, the second heat sink 406 can correspond to a heat-sink system, similar to the heat-sink system 350 in the example of FIG. 8. For example, the T-clad material arrangements 408 and 410 can each be coupled to a thermally-conductive component that can be coupled to the double-sided multilayer PCB 402 (e.g., similar to as demonstrated in the example of FIG. 5) or coupled directly to the MOSFET switches (e.g., similar to as described in the example of FIG. 7). In the example of FIG. 9, the heat-sink systems 404 and 406 are each demonstrated as including channels 412 for conducting a liquid coolant (e.g., water). Alternatively, the heat sink system 354 of FIG. 8 with channels 356 may be coupled to the PCB 402 via T-clad material arrangements 320.

There are many possible implementations of a liquid-cooled heat sink assembly consistent with the PCB 402, as described herein. In the example of FIG. 9, the heat sinks 404 and 406 are arranged differently relative to the heat-sink system 350 in the example of FIG. 8. Particularly, the heat sinks 404 and 406 are arranged such that the channels 412 are formed as approximately circular ports in the respective heat sinks 404 and 406, such as via an extrusion process. However, it is to be understood that the PCB 402 could instead include heat sinks that are arranged substantially similar to the heat-sink system 350 in the example of FIG. 8, such as including the rectangular liquid-conduction channels 356 that are sealed (e.g., via solder 360) by the cap 358. As an example, the thermally-conductive material piece 354 could be formed via casting or a cross-cut extrusion process.

Additionally, the circuit system 400 demonstrates a first flex portion 414 and a second flex portion 416 of the double-sided multilayer PCB 402 that extend from the remaining portions of the double-sided multilayer PCB 402. The flex portions 414 and 416 are demonstrated as having an approximate 90° bend and terminate at respective edges of the double-sided multilayer PCB 402. As an example, the flex portions 414 and 416 can correspond to the central two of the six conductive layers 304 that extend from the double-sided multilayer PCB 302 in the example of FIG. 7, and can thus be conductively coupled to an external capacitor PCB on which the flying capacitor systems 60 are mounted. For higher current applications, additional flexible layers may extend from the sides of the PCB 402. For example, the top layer pair and bottom layer pair of layers of the multilayer PCB 302 in the example of FIG. 7 may extend without the pre-preg layers 308 to maintain flexibility.

For example, similar to as described previously, the capacitor current associated with the flying capacitors (not shown in the example of FIG. 9) that is provided through a given one of the MOSFET switches is split approximately in half, with approximately one half of the capacitor current being provided approximately along the first flex portion 414 toward a respective edge of the double-sided multilayer PCB 402 and the approximately one half of the capacitor current being provided approximately along the second flex portion 416 toward a respective edge of the double-sided multilayer PCB 402. The capacitor currents can flow toward the respective edges of the first and second flex portions 414 and 416 on a first of the extended conductive layers of the double-sided multilayer PCB 402, and can return from the respective capacitors of a given flying capacitor system 60 via a second of the extended conductive layers, similar to as described previously. As an example, for applications where less capacitance is required, the flying capacitor systems may be coupled to extended regions of the same double-sided multilayer PCB 302, such as coupled to the inner conductive layers 304 that extend from the remaining layers toward the edges 332 and 334. The double-sided multilayer PCB 302 may be divided into rigid sections where components are mounted and into flex sections which allow the assembly to be folded into a more compact shape.

Referring back to the example of FIG. 7, as described previously, the T-clad material arrangements 320 can be coupled (e.g., soldered) to each of the thermally-conductive components 318 to provide heat-dissipation from the MOSFET switches 312 and 313. As an example, the T-clad material arrangement 320 can have an area profile that is approximately the same as the double-sided multilayer PCB 302. Therefore, a potting material 330 can fill substantially an entirety of a void between the double-sided multilayer PCB 302 and the T-clad material arrangement 320 including all voids around and under electrical components coupled to the double-sided multilayer PCB 302.

As an example, electrical connections between the double-sided multilayer PCB 302 and capacitor/gate-driver boards can be provided as rows of pins on the flex portions 414 and 416 soldered to interconnect boards. Neighboring pins can have up to the full DC bus voltage (e.g., approximately 5 kV, though substantially all voltage ratings can be accommodated) across them. Therefore, the potting material 330 can provide quality insulation in order to minimize the spacing between the respective pins. Using soldered pins as the electrical connection means is only one example, such that any other common means of making multi-conductor connections between circuits may also be used. As an example, the potting material 330 can be provided in the circuit system via a vacuum pressure impregnation (VPI) process after all connections (solder or otherwise) between the respective boards have been made to provide the potting material 330 as a resin similar to that used for encapsulating high-voltage motor windings. High-voltage motors can typically require the VPI resin to have zero voids to maintain long life from partial discharge failure modes. Thus, by implementing the VPI resin, substantially all void areas can be filled with the potting material 330 to substantially prevent exposure of any bare metal on any portion of the associated circuit system. Accordingly, the half-bridge circuit system(s) can be implemented in high-voltage motor driving applications with a substantially longer life than typical systems. As an example, after encapsulation with VPI resin to cover all surfaces and fill all small voids, additional potting compounds may be applied to fill larger voids.

Figure 10:
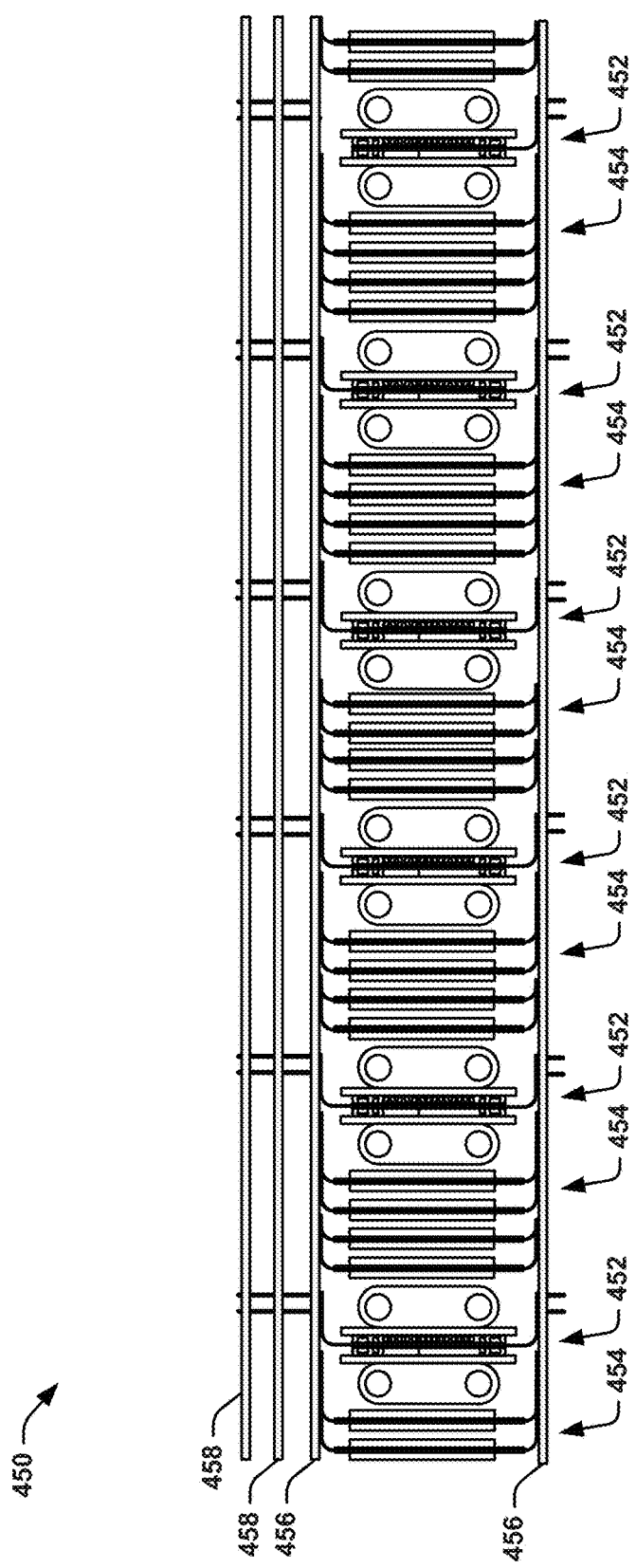
FIG. 10 illustrates another example of a circuit system.

FIG. 10 illustrates another example of a circuit board system 450. The circuit system 450 demonstrates a plurality of circuit systems 452 that can each correspond to a single one of the circuit systems 400 in the example of FIG. 9. In the example of FIG. 10, the circuit board system 450 includes six of the circuit systems 452. As an example, three of the circuit systems 452 can correspond to the half-bridge switching circuits 264 associated with the boost rectifier/interactive inverter 260 of the motor drive system 254 in the example of FIG. 6. Similarly, three of the circuit systems 452 can correspond to the half-bridge switching circuits 264 associated with the motor drive/boost rectifier 262 of the motor drive system 254 in the example of FIG. 6. In the example of FIG. 10, the circuit board system 450 also includes a plurality of capacitor boards 454. As an example, each of the circuit systems 452 can have four associated capacitor boards 454. The capacitor boards 454 can each include one or more of the flying capacitor systems 60, connected such that the current to each flying capacitor system 60 is divided approximately evenly to each of the respective edges of the PCBs associated with the circuit systems 452, as described herein. In the example of FIG. 10, the circuit systems 452 and the capacitor boards 454 are coupled by interconnect boards 456 that provide conductive coupling between the circuit systems 452 and capacitor boards 454 (e.g., to conduct the capacitor current $I_{CAP1}$ and $I_{CAP2}$ for each flying capacitor system 60).

Alternatively, each circuit system 452 could connect to its own capacitor boards 454 with individual interconnect boards that are not common to the other circuit systems. A common interconnect board 456 can be provided for simplicity and because the DC bus may be shared, and the interconnect board 456 can facilitate the common electrical connections. Additionally, the circuit board system 450 can include additional boards 458 that can accommodate additional control components. As an example, subsequent to soldering and connecting all of the circuit systems 452 and capacitor boards 454, a VPI resin process can be provided to provide potting material to each of the circuit systems 452 and capacitor boards 454 to substantially cover all exposed connections to facilitate use of the circuit board system 450 in high-voltage applications. The example of FIG. 10 shows six circuit systems 452, but different numbers of circuit systems 452 may be combined depending on the application.

FIGS. 11-15 illustrate additional examples of the embodiments described herein.

Figure 11:
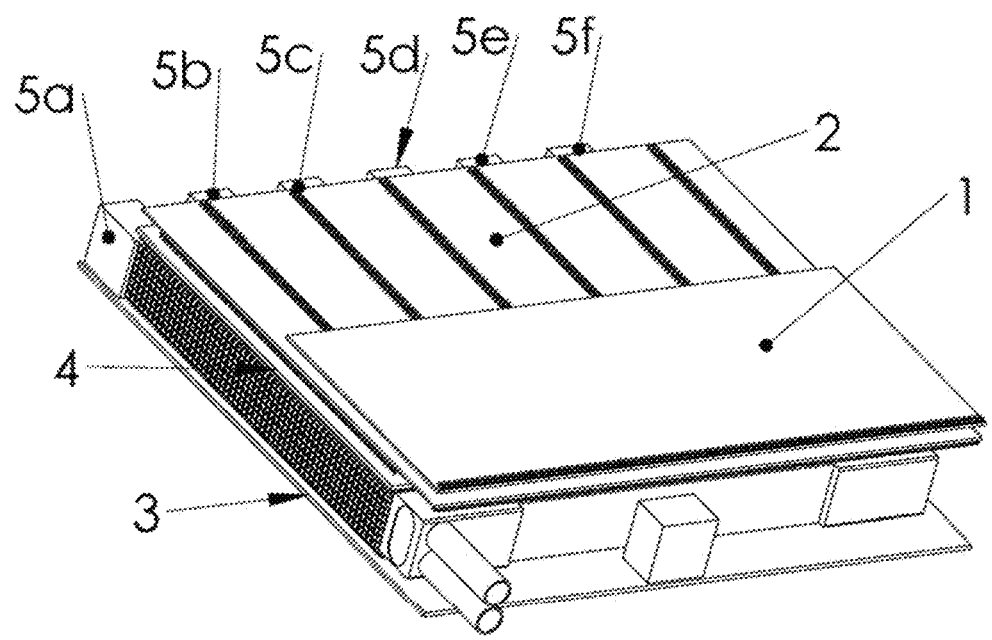
FIG. 11 illustrates yet another example of a circuit system.

FIG. 11 illustrates an assembly of a regenerative drive and includes six half-bridge circuits. Reference number 1 is the digital control board, and reference number 2 is the driver board. Reference numbers 3 and 4 are the interconnect boards. Reference numbers 5*a* through 5*f* are the filters.

Figure 12:
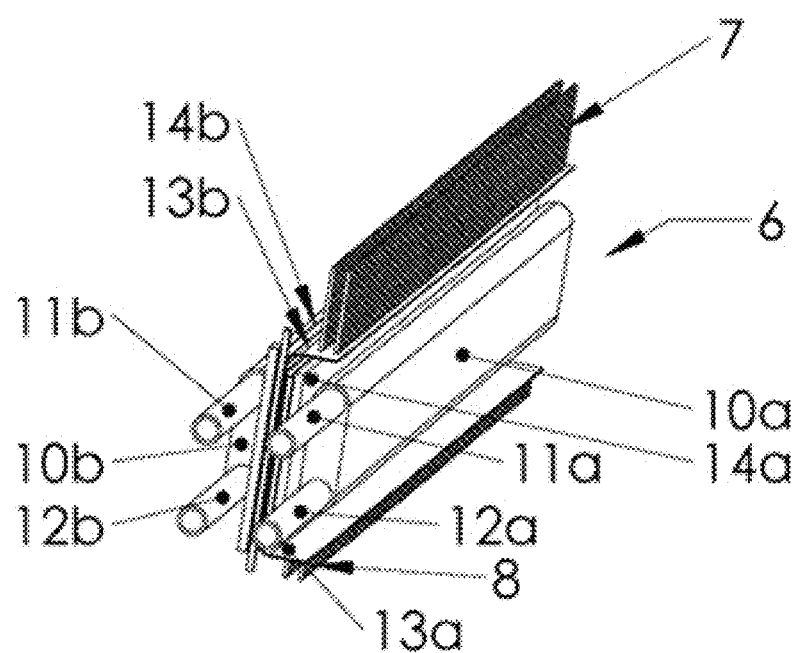
FIG. 12 illustrates yet another example of a circuit system.

FIG. 12 illustrates one of the half-bridge modules (reference number 6). A double-sided circuit board 15 is shown that has flex circuit layers protruding out the ends at 13*a* and 13*b*. T-clad board metal heatsinks are shown in 14*a* and 14*b* are assembled together with the double sided circuit board. Water cooled heatsinks 10*a* and 10*b* are connected to the T-clad boards to remove the heat. Water goes in and out of fluid connections 11*a*, 11*b*, 12*a*, and 12*b*.

Figure 13:
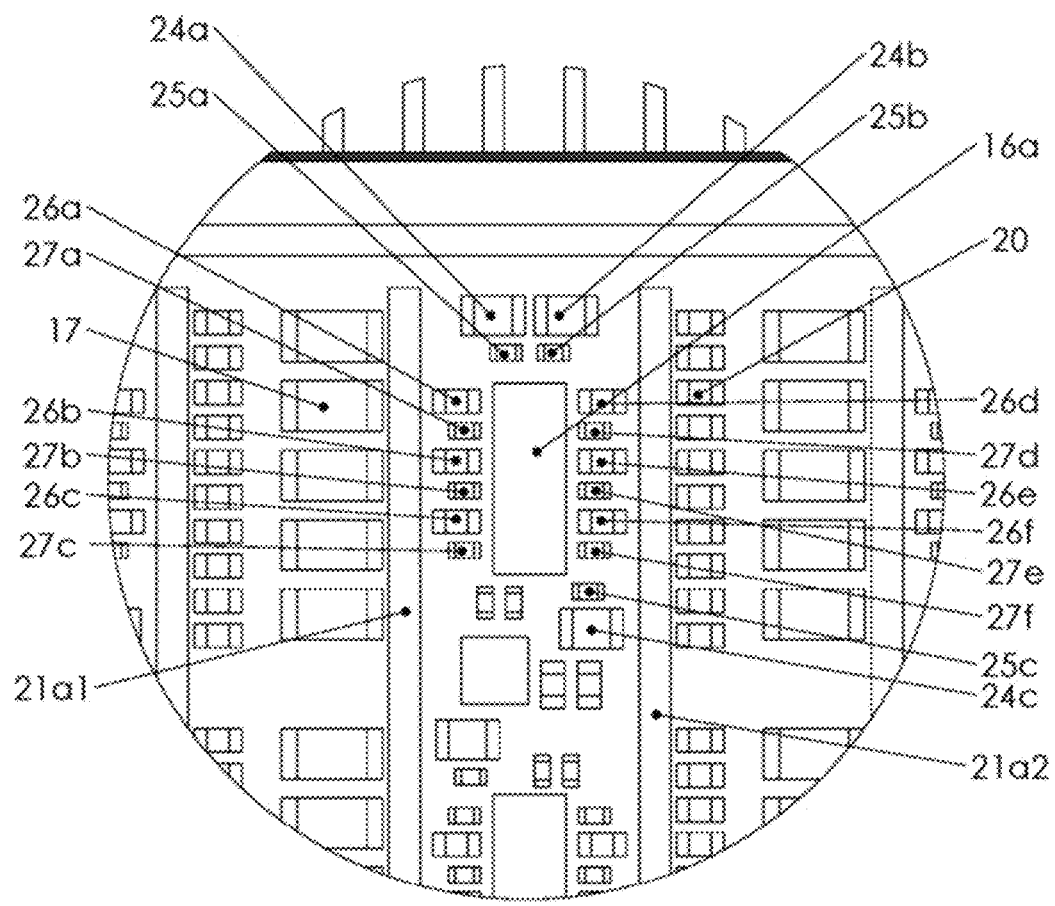
FIG. 13 illustrates yet another example of a circuit system.
Figure 14:
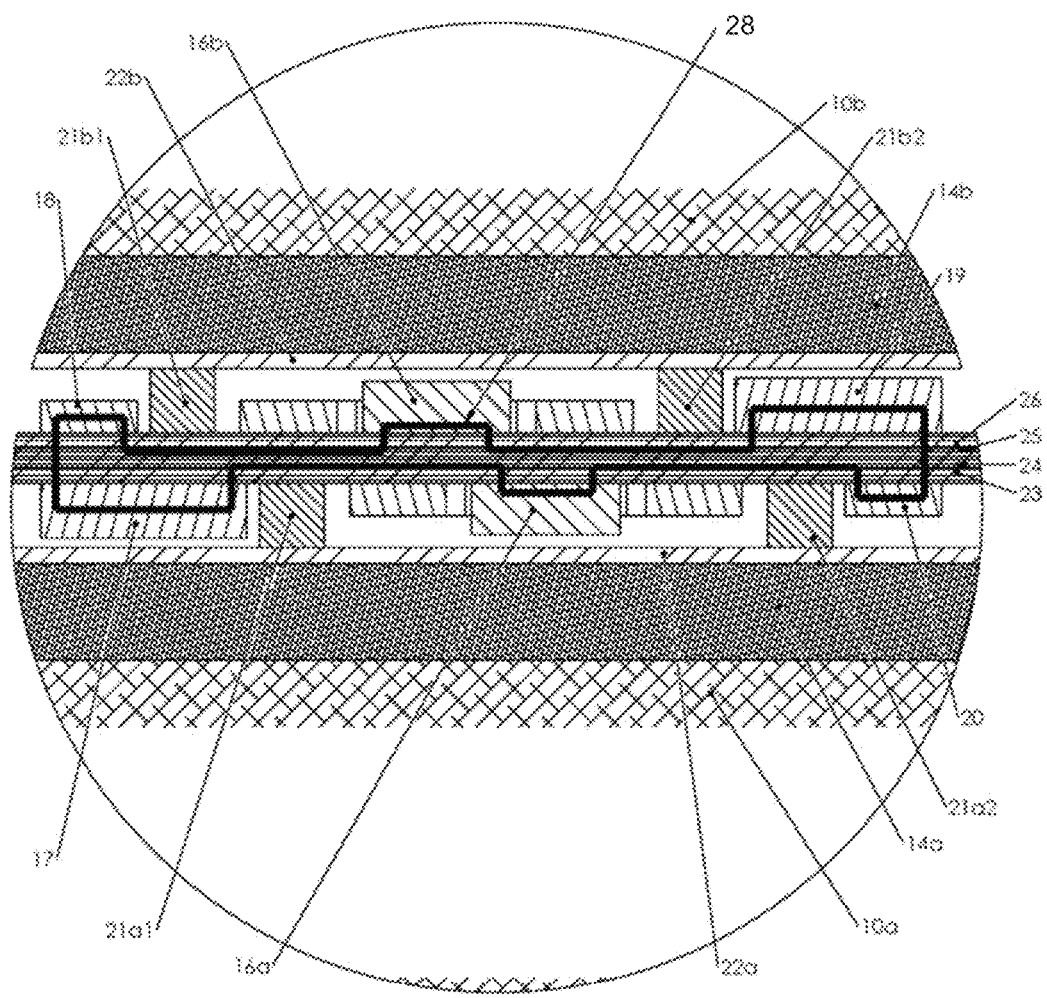
FIG. 14 illustrates yet another example of a circuit system.

FIG. 13 shows another example of the component layout surrounding the MOSFET 16*a* on one side of the double sided circuit board, and FIG. 14 shows another example of a detailed cross section of the half-bridge module. Like reference numbers are provided in the following description of the examples of FIGS. 13 and 14.

T-clad boards have copper layer(s) 22*a*, 22*b* which can be patterned like a circuit board layer to prevent short circuits. The complementary MOSFETs are demonstrated at 16*a* and 16*b*, and the capacitors 17, 19 and resistors 18, 20 are part of snubber circuits across the flying capacitors. The dark lines 28 in FIG. 14 demonstrate the critical loop inductance for the snubber circuits. In another example, the resistor and capacitor can be in series on the same side of the PCB with the return path on the adjacent layer. Reference numbers 21*a*1, 21*a*2, 21*b*1, 21*b*2 are copper bars that are soldered both to double-sided circuit-board and to T-clad boards. Capacitor 17 is part of a row of capacitors all in parallel and resistor 20 is part of a row of resistors all in parallel. Snubber circuits across the MOSFETs are shown with capacitors 24*a* through 24*c* and 26*a* through 26*e*, and resistors 25*a* through 25*c* and 27*a* through 27*e* that are arranged around the MOSFET in such a manner to exhibit low inductance. In another example, the snubber components across the switches may be omitted so only the snubber components across the flying capacitors remain. In a further example, all snubber circuits may be omitted.

A four-layer double-sided circuit board is shown that has layers 23-26. The inner two layers 24, 25 are made from a flexible circuit board where the outer layers 23, 26 are added with rigid insulating layers. 16*a* is one MOSFET (e.g., the MOSFET 312 in the example of FIG. 7) while 16*b* is the complementary MOSFET (e.g., the MOSFET 313 in the example of FIG. 7). Reference numbers 26 and 27 are the capacitor and resistor of the snubber around the MOSFET (see FIG. 7 for top view). Reference numbers 17 and 18 are the resistor and capacitor of the snubber across the flying capacitor. The bold line 28 shows the current loop around the two MOSFETs and adjacent flying-capacitor snubbers. FIG. 13 shows many parallel R-C snubber circuits for both the MOSFET snubbers and the flying-capacitor snubbers. Reference numbers 21 are the copper thermal bars soldered between the double-sided board and the T-clad boards.

Figure 15:
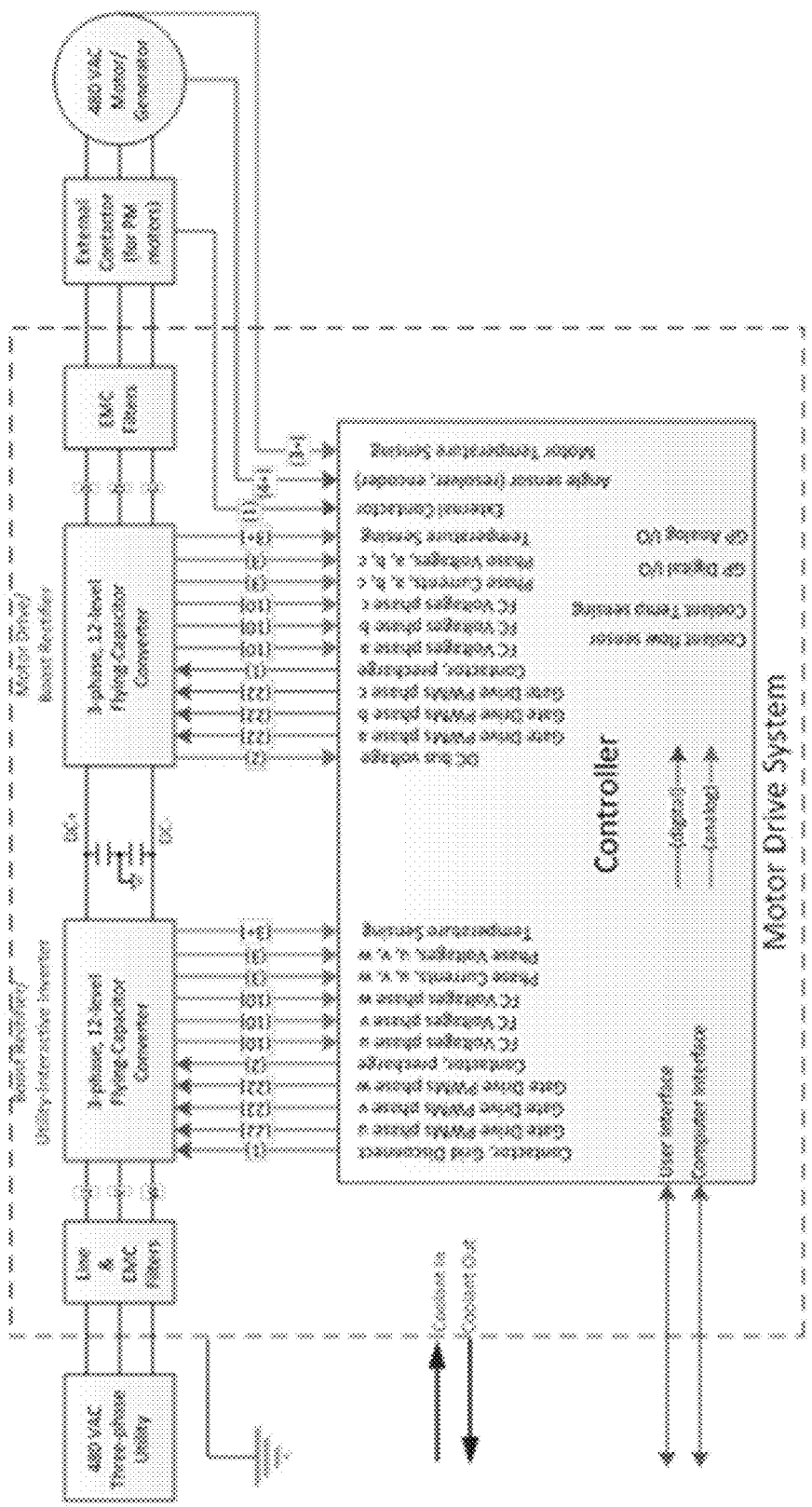
FIG. 15 illustrates yet another example of a motor system.

FIG. 15 shows a block diagram of a complete motor-drive system. Angle feedback from the motor/generator may be obtained from a dedicated sensor (resolver or encoder) or using sensor-less angle sensing techniques which observe the voltages and currents at the motor leads throughout the electrical cycle of the drive. As an example, the flying capacitor converter is implemented with MOSFETs, which may be Si MOSFETs, Si—C MOSFETs, or GaN MOSFETs. Although there are twelve levels shown in the illustrative embodiment, it is understood that any number of levels may be used.

What have been described above are example embodiments. It is, of course, not possible to describe every conceivable combination of components or methodologies for purposes of describing the embodiments, but one of ordinary skill in the art will recognize that many further combinations and permutations of the embodiments are possible. Accordingly, the embodiments are intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A system comprising:
    a half-bridge switching circuit configured to provide an output voltage via an output, the half-bridge switching circuit comprising a first plurality of switches arranged between a first rail voltage and the output and a second plurality of switches arranged between a second rail voltage and the output, the first and second pluralities of switches being controlled via a plurality of switching signals, the half-bridge switching circuit further comprising a plurality of flying capacitors arranged to interconnect the first and second pluralities of switches; and
    a double-sided printed-circuit board (PCB) comprising a first surface on which the first plurality of switches are arranged and a second surface on which the second plurality of switches are arranged, the second surface being opposite the first surface on the double-sided PCB.

2. The system of claim 1, further comprising:
    at least one first thermally-conductive component configured to conduct heat associated with at least one of the first plurality of switches;
    a first T-clad material arrangement that is coupled to the at least one first thermally-conductive component to conduct heat from the at least one first thermally-conductive component;
    at least one second thermally-conductive component configured to conduct heat associated with at least one of the second plurality of switches; and
    a second T-clad material arrangement that is coupled to the at least one second thermally-conductive component to conduct heat from the at least one second thermally-conductive component.

3. The system of claim 1, wherein the double-sided PCB is arranged as a multi-layer double-sided PCB comprising a plurality of layers, wherein each of the plurality of flying capacitors is conductively routed to a respective sequential pair of the first plurality of switches via a first conductive layer of the plurality of layers and conductively routed to a respective sequential pair of the second plurality of switches via a second conductive layer of the plurality of layers adjacent to the first conductive layer.

4. The system of claim 1, further comprising a plurality of snubber circuits, wherein each of the plurality of flying capacitors, each of the first plurality of switches, and each of the second plurality of switches is arranged in parallel with a respective one of the plurality of snubber circuits.

5. The system of claim 1, wherein the capacitance of a flying capacitor is divided such that approximately half of the capacitance is connected to approximately a first edge of the PCB and approximately half of the capacitance is connected to approximately a second edge of the PCB opposite the first edge of the PCB.

6. A motor driver system comprising the system of claim 1, wherein the half-bridge switching circuit is a first half-bridge switching circuit, the system further comprising a second half-bridge switching circuit and a third half-bridge switching circuit, wherein the first, second, and third half-bridge switching circuits are configured to provide a respective first, second, and third output voltage via respective outputs to respective first, second, and third phases of a three-phase motor based on the first rail voltage and the second rail voltage.

7. The motor driver system of claim 6, further comprising a fourth half-bridge switching circuit, a fifth half-bridge switching circuit, and a sixth half-bridge switching circuit that are collectively configured to convert a three-phase line voltage into the first rail voltage and the second rail voltage.

8. The motor driver system of claim 6, wherein the motor controller is configured to generate the plurality of switching signals based at least in part on at least one angular feedback signal provided from the motor.

9. A system comprising:
a half-bridge switching circuit configured to provide an output voltage via an output, the half-bridge switching circuit comprising a first plurality of switches arranged between a first rail voltage and the output and a second plurality of switches arranged between a second rail voltage and the output, the first and second pluralities of switches being controlled via a plurality of switching signals, the half-bridge switching circuit further comprising a plurality of flying capacitors arranged to interconnect the first and second pluralities of switches; and
a printed-circuit board (PCB) on which the first and second pluralities of switches and the plurality of flying capacitors are arranged, the capacitance of each of the flying capacitor systems being divided such that approximately half of the capacitance is connected to approximately a first edge of the double-sided PCB and approximately half of the capacitance is connected to approximately a second edge of the double-sided PCB opposite the first edge of the PCB.

10. The system of claim 9, wherein the PCB comprises:
a first conductive layer to which terminals of the first plurality of switches and a first terminal of each of the plurality of flying capacitors are routed; and
a second conductive layer to which terminals of the second plurality of switches and a second terminal of each of the plurality of flying capacitors are routed.

11. The system of claim 10, wherein the first conductive layer and the second conductive layer are adjacent layers of the PCB, wherein each of the plurality of flying capacitors is conductively coupled to a respective sequential pair of the first plurality of switches via the first conductive layer and a respective sequential pair of the second plurality of switches via the second conductive layer.

12. The system of claim 10, wherein the PCB further comprises a third layer coupled to the first conductive layer and a fourth layer coupled to the second conductive layer, such that the first and second conductive layers are adjacent and arranged between the third and fourth layers of the double-sided PCB.

13. The system of claim 9, wherein the PCB is arranged as a double-sided PCB, wherein the first plurality of switches are arranged on a first surface of the double-sided PCB and the second plurality of switches are arranged on a second surface of the double-sided PCB opposite the first surface on the double-sided PCB.

14. The system of claim 9, further comprising a plurality of snubber circuits, wherein each of the plurality of flying capacitors, each of the first plurality of switches, and each of the second plurality of switches is arranged in parallel with a respective one of the plurality of snubber circuits.

15. A motor driver system comprising the system of claim 9, wherein the half-bridge switching circuit is a first half-bridge switching circuit, the system further comprising a second half-bridge switching circuit and a third half-bridge switching circuit, wherein the first, second, and third half-bridge switching circuits are configured to provide a respective first, second, and third output voltage via respective outputs to respective first, second, and third phases of a three-phase motor based on the first rail voltage and the second rail voltage.

16. A half-bridge switching circuit system comprising:
a first plurality of switches arranged between a first rail voltage and an output on which an output voltage is provided, such that the first plurality of switches are arranged on a first surface of a double-sided printed-circuit board (PCB);
a second plurality of switches arranged between a second rail voltage and the output, the first and second pluralities of switches being controlled via a plurality of switching signals, such that the second plurality of switches are arranged on a second surface of the double-sided PCB that is opposite the first surface;
a plurality of flying capacitors arranged to interconnect the first and second pluralities of switches; and
a plurality of snubber circuits that are each arranged in parallel with a respective one of the plurality of flying capacitors.

17. The system of claim 16, wherein the half-bridge switching circuit is disposed on a multilayer printed-circuit board (PCB) comprising a plurality of layers, wherein each of the plurality of flying capacitors is conductively routed to a respective sequential pair of the first plurality of switches via a first conductive layer of the plurality of layers and conductively routed to a respective sequential pair of the second plurality of switches via a second conductive layer of the plurality of layers adjacent to the first conductive layer.

18. A motor driver system comprising the half-bridge switching circuit system of claim 16, the motor driver system further comprising a motor controller configured to generate the plurality of switching signals, such that the half-bridge switching circuit system is configured to generate the output voltage that is provided to a motor.

19. A system comprising:
a half-bridge switching circuit configured to provide an output voltage via an output, the half-bridge switching circuit comprising a first plurality of switches arranged between a first rail voltage and the output and a second plurality of switches arranged between a second rail voltage and the output, the first and second pluralities of switches being controlled via a plurality of switching signals, the half-bridge switching circuit further comprising a plurality of flying capacitors arranged to interconnect the first and second pluralities of switches; and
a multilayer printed-circuit board (PCB) on which the first and second pluralities of switches are arranged, the multilayer PCB comprising a plurality of layers, wherein a capacitor current is configured to flow toward an approximate edge of one of the plurality of conductive layers of the multilayer PCB via a respective conductor associated with the first layer, through one of the plurality of flying capacitors, and from an associated edge of a second one of the plurality of layers in a second direction opposite the first direction via a respective conductor associated with the second layer.

20. The system of claim 19, wherein the first layer of the multilayer PCB and the second layer of the multilayer PCB are separated by a polymer layer.

21. The system of claim 20, wherein the polymer layer is configured as a polyimide insulating layer that is arranged between each of the plurality of layers of the multilayer PCB.

22. The system of claim 19, the system further comprising at least one capacitor board that is coupled to the multilayer PCB at approximately a first edge of the multilayer PCB and approximately a second edge of the multilayer PCB opposite the first edge, the at least one capacitor board comprising the plurality of flying capacitors.

23. The system of claim 22, wherein the first and second layers of the multilayer PCB extend laterally beyond at least one edge associated with each of the remaining layers of the plurality of layers of the multilayer PCB to provide electromechanical coupling to the at least one capacitor board.

24. The system of claim 19, wherein each of the plurality of flying capacitors is arranged as at least one first capacitor and at least one second capacitor arranged in parallel, wherein a first half of the capacitance of the respective one of the plurality of flying capacitors is associated with the at least one first capacitor and a second half of the capacitance of the respective one of the plurality of flying capacitors is associated with the at least one second capacitor.

25. The system of claim 24, wherein a first half of the capacitor current is configured to flow toward an approximate first edge of the given one of the plurality of layers of the multilayer PCB via a respective conductor associated with the first layer, through the at least one first capacitor to the first edge of the second one of the plurality of layers, and from the first edge of the second one of the plurality of layers in the second direction via a respective conductor associated with the second layer, wherein a second half of the capacitor current is configured to flow toward an approximate second edge of the given one of the plurality of layers of the multilayer PCB that is opposite the first edge via a respective conductor associated with the first layer, through the at least one second capacitor to the second edge of the second one of the plurality of layers, and from the second edge of the second one of the plurality of layers in the second direction via a respective conductor associated with the second layer.

26. The system of claim 19, wherein the multilayer PCB is arranged as a double-sided multilayer PCB, wherein the first plurality of switches are arranged on a first surface of the double-sided PCB and the second plurality of switches are arranged on a second surface of the double-sided PCB opposite the first surface on the double-sided PCB.

27. A motor driver system comprising the system of claim 19, wherein the half-bridge switching circuit is a first half-bridge switching circuit, the system further comprising a second half-bridge switching circuit and a third half-bridge switching circuit, wherein the first, second, and third half-bridge switching circuits are configured to provide a respective first, second, and third output voltage via respective outputs to respective first, second, and third phases of a three-phase motor based on the first rail voltage and the second rail voltage.

28. A system comprising:
a half-bridge switching circuit configured to provide an output voltage via an output, the half-bridge switching circuit comprising a first plurality of switches arranged between a first rail voltage and the output and a second plurality of switches arranged between a second rail voltage and the output, the first and second pluralities of switches being controlled via a plurality of switching signals, the half-bridge switching circuit further comprising a plurality of flying capacitors arranged to interconnect the first and second pluralities of switches;
a first printed-circuit board (PCB) on which the first and second pluralities of switches are arranged; and
at least one additional PCB on which the plurality of flying capacitors are arranged, the at least one additional PCB being conductively coupled to the first PCB to provide the interconnection of the plurality of flying capacitors with respect to the first and second pluralities of switches.

29. The system of claim 28, wherein the first PCB is arranged as a multilayer PCB comprising a plurality of layers, wherein a capacitor current is configured to flow toward an approximate edge of one of the plurality of layers of the multilayer PCB via a respective conductor associated with the first layer to the at least one additional PCB, through one of the plurality of flying capacitors on the at least one additional PCB, and from an associated edge of a second one of the plurality of layers of the first PCB in a second direction opposite the first direction via a respective conductor associated with the second layer.

30. The system of claim 29, wherein a first half of the capacitor current is configured to flow toward an approximate first edge of the given one of the plurality of layers of the multilayer PCB via a respective conductor associated with the first layer, through at least one first capacitor to the first edge of the second one of the plurality of layers, and from the first edge of the second one of the plurality of layers in the second direction via a respective conductor associated with the second layer, wherein a second half of the capacitor current is configured to flow toward an approximate second edge of the given one of the plurality of layers of the multilayer PCB that is opposite the first edge via a respective conductor associated with the first layer, through at least one second capacitor to the second edge of the second one of the plurality of layers, and from the second edge of the second one of the plurality of layers in the second direction via a respective conductor associated with the second layer.

31. The system of claim 29, wherein the first layer of the multilayer PCB and the second layer of the multilayer PCB are separated by a polymer layer.

32. The system of claim 31, wherein the polymer layer is configured as a polyimide insulating layer that is arranged between each of the plurality of layers of the multilayer PCB.

33. The system of claim 28, wherein each of the plurality of flying capacitors is arranged as at least one first capacitor and at least one second capacitor arranged in parallel, wherein a first half of the capacitance of the respective one of the plurality of flying capacitors is associated with the at least one first capacitor and a second half of the capacitance of the respective one of the plurality of flying capacitors is associated with the at least one second capacitor.

34. The system of claim 28, wherein the first PCB is arranged as a double-sided PCB, wherein the first plurality of switches are arranged on a first surface of the first PCB and the second plurality of switches are arranged on a second surface of the first PCB opposite the first surface on the first PCB.

35. A motor driver system comprising the system of claim 28, wherein the half-bridge switching circuit is a first half-bridge switching circuit, the system further comprising a second half-bridge switching circuit and a third half-bridge switching circuit, wherein the first, second, and third half-bridge switching circuits are configured to provide a respective first, second, and third output voltage via respective outputs to respective first, second, and third phases of a three-phase motor based on the first rail voltage and the second rail voltage.

36. A circuit system comprising:
a printed-circuit board (PCB) comprising a surface on which a plurality of circuit components are arranged via a bottom surface of the respective plurality of circuit components;
at least one thermally-conductive component that is coupled to a metalized top surface of at least one of the plurality of circuit components, the at least one thermally-conductive component being configured to conduct heat that is generated by the respective at least one of the plurality of circuit components; and
a T-clad material arrangement that is coupled to the at least one thermally-conductive component via a first material layer of the T-clad material arrangement and is spaced apart from the respective at least one of the plurality of circuit components via the at least one thermally-conductive component, the T-clad material arrangement being configured to conduct the heat from the at least one thermally-conductive component to the first material layer of the T-clad material arrangement to radiate the heat from a second material layer of the T-clad material arrangement that is on an opposite surface of the T-clad material arrangement relative to the first material layer.

37. The system of claim 36, wherein the PCB is configured as a double-sided PCB comprising a first surface on which a first plurality of circuit components are arranged and a second surface on which a second plurality of circuit components are arranged, the second surface being opposite the first surface on the double-sided PCB, wherein the at least one thermally-conductive component that is coupled to the first surface of the double-sided PCB, wherein the T-clad material arrangement is configured as a first T-clad material arrangement that is coupled to the at least one first thermally-conductive component, the circuit system further comprising:
at least one second thermally-conductive component that is coupled to the second surface of the double-sided PCB, the at least one second thermally-conductive component being configured to conduct heat that is generated on the double-sided PCB via the second plurality of circuit components; and
a second T-clad material arrangement that is coupled to the at least one second thermally-conductive component via a respective first material layer and is configured to conduct the heat from the at least one second thermally-conductive component to the respective first material layer.

38. The system of claim 36, further comprising a potting material that fills substantially an entirety of a void between the PCB and the first layer of the T-clad material arrangement, the potting material being provided via a vacuum pressure impregnation (VPI) process.

39. The system of claim 36, further comprising a heat-sink system coupled to the second material layer of the T-clad material arrangement, the heat-sink system being configured to conduct the heat from the second material layer of the T-clad material arrangement.

40. The system of claim 39, wherein the heat-sink system further comprises at least one liquid coolant channel configured to conduct a liquid coolant to dissipate the heat-sink system.

41. The system of claim 36, wherein the plurality of circuit components are arranged as a half-bridge switching circuit comprising:
a first plurality of switches arranged between a first rail voltage and an output on which an output voltage is provided; and
a second plurality of switches arranged between a second rail voltage and the output, the first and second pluralities of switches being controlled via a plurality of switching signals;
a plurality of flying capacitors arranged to interconnect the first and second pluralities of switches.

42. A motor driver system comprising the half-bridge switching circuit system of claim 41, the motor driver system further comprising a motor controller configured to generate the plurality of switching signals, such that the half-bridge switching circuit system is configured to generate the output voltage that is provided to a motor.

43. A circuit system comprising:
a printed-circuit board (PCB) comprising a surface on which a plurality of circuit components are arranged;
at least one thermally-conductive component that is configured to conduct heat that is generated via at least one of the plurality of circuit components;
a T-clad material arrangement that is coupled to the at least one thermally-conductive component via a first material layer of the T-clad material arrangement, the T-clad material arrangement being configured to conduct the heat from the at least one thermally-conductive component to the first material layer of the T-clad material arrangement to radiate the heat from a second material layer of the T-clad material arrangement that is on an opposite surface of the T-clad material arrangement relative to the first material layer; and
potting material that encapsulates substantially all bare metal in the volume between the PCB and the first layer of the T-clad material arrangement.

44. The system of claim 43, wherein the at least one thermally-conductive component is coupled to a metalized top surface of at least one of the plurality of circuit components, the at least one thermally-conductive component being configured to conduct heat that is generated by the respective at least one of the plurality of circuit components.

45. The system of claim 43, wherein the at least one thermally-conductive component is coupled to the PCB, the at least one thermally-conductive component being configured to conduct heat that is generated on the PCB via the plurality of circuit components.

46. The system of claim 43, wherein the PCB is configured as a double-sided PCB comprising a first surface on which a first plurality of circuit components are arranged and a second surface on which a second plurality of circuit components are arranged, the second surface being opposite the first surface on the double-sided PCB, wherein the at least one thermally-conductive component that is coupled to the first surface of the double-sided PCB, wherein the T-clad material arrangement is configured as a first T-clad material arrangement that is coupled to the at least one first thermally-conductive component, the circuit system further comprising:

at least one second thermally-conductive component that is coupled to the second surface of the double-sided PCB, the at least one second thermally-conductive component being configured to conduct heat that is generated on the double-sided PCB via the second plurality of circuit components; and a second T-clad material arrangement that is coupled to the at least one second thermally-conductive component via a respective first material layer and is configured to conduct the heat from the at least one second thermally-conductive component to the respective first material layer.

47. The system of claim 43, wherein the potting material comprises a resin that is provided via a vacuum pressure impregnation (VPI) process.

48. The system of claim 43, further comprising a heat-sink system coupled to the second material layer of the T-clad material arrangement, the heat-sink system being configured to conduct the heat from the second material layer of the T-clad material arrangement.

49. The system of claim 48, wherein the heat-sink system further comprises at least one liquid coolant channel configured to conduct a liquid coolant to dissipate the heat-sink system.

50. The system of claim 43, wherein the plurality of circuit components are arranged as a half-bridge switching circuit comprising:

a first plurality of switches arranged between a first rail voltage and an output on which an output voltage is provided;

a second plurality of switches arranged between a second rail voltage and the output, the first and second pluralities of switches being controlled via a plurality of switching signals; and a plurality of flying capacitors arranged to interconnect the first and second pluralities of switches.

51. A motor driver system comprising the half-bridge switching circuit system of claim 50, the motor driver system further comprising a motor controller configured to generate the plurality of switching signals, such that the half-bridge switching circuit system is configured to generate the output voltage that is provided to a motor.

* * * * *